(12) United States Patent
Lee et al.

(10) Patent No.: US 11,830,561 B2
(45) Date of Patent: Nov. 28, 2023

(54) STORAGE DEVICES AND METHODS OF OPERATING STORAGE DEVICES

(71) Applicant: SAMSUNG ELECTRONICS CO., LTD., Suwon-si (KR)

(72) Inventors: Youngmin Lee, Seoul (KR); Soongmann Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/697,240

(22) Filed: Mar. 17, 2022

(65) Prior Publication Data

US 2023/0094273 A1   Mar. 30, 2023

(30) Foreign Application Priority Data

Sep. 28, 2021   (KR) .................. 10-2021-0127717

(51) Int. Cl.
| | | |
|---|---|---|
| *G11C 29/36* | (2006.01) | |
| *G11C 29/46* | (2006.01) | |
| *G11C 29/12* | (2006.01) | |
| *G11C 29/18* | (2006.01) | |
| *G11C 29/56* | (2006.01) | |

(52) U.S. Cl.
CPC ........ *G11C 29/36* (2013.01); *G11C 29/12005* (2013.01); *G11C 29/18* (2013.01); *G11C 29/46* (2013.01); *G11C 29/56004* (2013.01); *G11C 29/56012* (2013.01);
(Continued)

(58) Field of Classification Search
CPC ... G11C 29/36; G11C 29/12005; G11C 29/18; G11C 29/46; G11C 29/56004; G11C 29/56012; G11C 2029/1202; G11C 2029/1802; G11C 2029/3602; G11C 2029/0407; G11C 2029/5002; G11C 29/028; G11C 29/006; G11C 16/26; G11C 29/42; G06F 3/0658; G06F 3/0604; G06F 3/0626; G06F 3/0653; G06F 3/0679; G06F 11/1044; G06F 11/1048
See application file for complete search history.

(56) References Cited

U.S. PATENT DOCUMENTS

| | | |
|---|---|---|
| 7,257,044 B2 | 8/2007 | Momii et al. |
| 7,550,789 B2 | 6/2009 | Bonaccio et al. |
(Continued)

FOREIGN PATENT DOCUMENTS

JP   2004-260032 A   9/2004

*Primary Examiner* — Mohammed A Bashar
(74) *Attorney, Agent, or Firm* — Sughrue Mion, PLLC

(57) ABSTRACT

Example embodiments provide for a storage device that includes a storage controller including a plurality of analog circuits and at least one nonvolatile memory device including a first region and a second region. The at least one nonvolatile memory device stores user data in the second region and stores trimming control codes in the first region as a compensation data set. The trimming control codes are configured to compensate for offsets of the plurality of analog circuits and are obtained through a wafer-level test on the storage controller. The storage controller, during a power-up sequence, reads the compensation data set from the first region of the at least one nonvolatile memory device, stores the read compensation data set therein, and adjusts the offsets of the plurality of analog circuits based on the stored compensation data set.

20 Claims, 23 Drawing Sheets

(52) U.S. Cl.
　　　CPC ............... *G11C 2029/1202* (2013.01); *G11C 2029/1802* (2013.01); *G11C 2029/3602* (2013.01)

(56) References Cited

U.S. PATENT DOCUMENTS

| | | |
|---|---|---|
| 7,659,168 B2 | 2/2010 | Hsu et al. |
| 7,890,832 B2 | 2/2011 | Dunipace |
| 7,990,778 B2 | 8/2011 | Oku |
| 8,593,887 B2 | 11/2013 | Nakanishi et al. |
| 8,873,320 B2 | 10/2014 | Goel et al. |
| 8,929,158 B1 | 1/2015 | Wang et al. |
| 9,870,989 B2 | 1/2018 | Basker et al. |
| 11,572,183 B1 * | 2/2023 | Overfield ................ B60L 50/66 |
| 2020/0133510 A1 * | 4/2020 | Koudele ............... G06F 3/0614 |
| 2023/0202675 A1 * | 6/2023 | Moy ..................... B64D 45/00 701/3 |

* cited by examiner

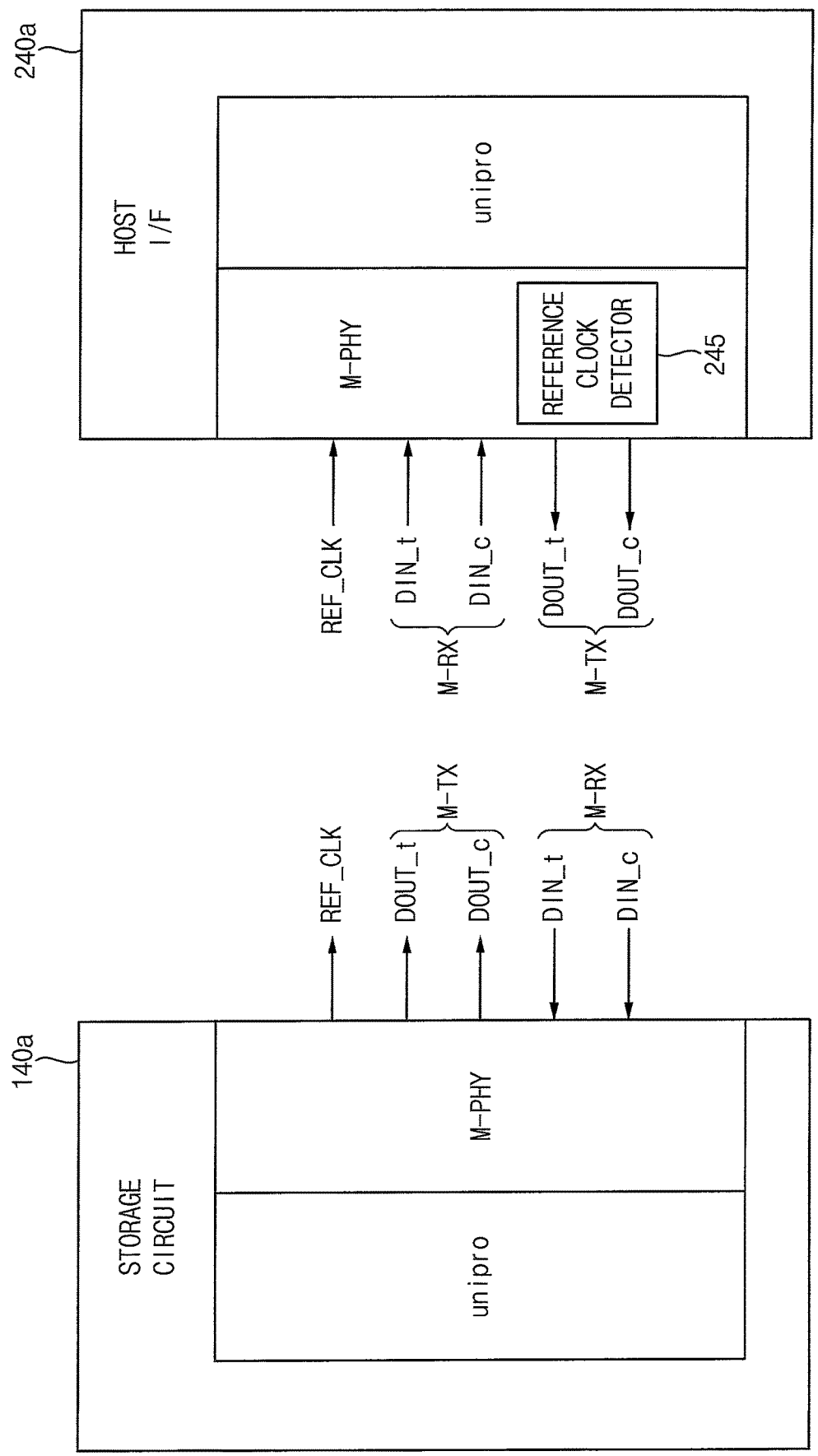

STORAGE DEVICES AND METHODS OF OPERATING STORAGE DEVICES

CROSS-REFERENCE TO RELATED APPLICATIONS

This application claims benefit of priority under 35 U.S.C. § 119 to Korean Patent Application No. 10-2021-0127717, filed on Sep. 28, 2021 in the Korean Intellectual Property Office, the disclosure of which is incorporated by reference herein in its entirety.

BACKGROUND

1. Technical Field

The present disclosure generally relates to data processing devices, and more particularly, to storage devices and methods of operating storage devices.

2. Discussion of the Related Art

A computing device may include a desktop computer, a notebook computer, a smart phone, a smart tablet, etc. A hard disk drive has traditionally been used as a storage device. However, a mobile device, such as a smart phone, a smart tablet, etc., may use a nonvolatile memory device, such as a NAND flash memory, a phase-change RAM (PRAM), a magnetic RAM (MRAM), a resistive RAM (RRAM), a ferroelectric RAM (FRAM), etc., as a storage device. A frequency of using a nonvolatile memory device as a storage device even in a notebook computer and a desktop computer is on the increase.

Offset compensation information of analog circuits in a storage controller to control a nonvolatile memory device may be stored in an electrical fuse (E-fuse) of the storage controller, which may increase a size of the storage controller.

SUMMARY

Some example embodiments may provide a storage device capable of reducing a size of a storage controller to control a nonvolatile memory device.

Some example embodiments may provide a method of operating a storage device, capable of reducing a size of a storage controller to control a nonvolatile memory device.

According to some example embodiments, a storage device includes a storage controller including a plurality of analog circuits, and at least one nonvolatile memory device including a first region and a second region. The at least one nonvolatile memory device stores user data in the second region, and stores trimming control codes in the first region as a compensation data set. The trimming control codes are configured to compensate for offsets of the plurality of analog circuits, and are obtained through a wafer-level test on the storage controller. The storage controller, during a power-up sequence, is configured to read the compensation data set from the first region of the at least one nonvolatile memory device, store the read compensation data set therein, and adjust the offsets of the plurality of analog circuits based on the stored compensation data set.

According to some example embodiments, there is provided a method of operating a storage device, which includes at least one nonvolatile memory device including a first region and a second region, and a storage controller to control the at least one nonvolatile memory device. The method includes operating, by the storage controller, at a first speed to read trimming control codes in the first region as a compensation data set. The trimming control codes compensate for offsets of a plurality of analog circuits, and are obtained through a wafer-level test on the storage controller. The method further includes storing the read compensation data set in a static random access memory (SRAM) in the storage controller. The method further includes operating, by the storage controller, at a second speed faster than the first speed to adjust the offsets of the plurality of analog circuits based on the compensation data set stored in the SRAM.

According to some example embodiments, a storage device includes a storage controller including a plurality of analog circuits, and at least one nonvolatile memory device including a first region and a second region. The plurality of analog circuits are configured to provide outputs varying based on respective one of a plurality of control codes. The at least one nonvolatile memory device is configured to store user data in the second region. The at least one nonvolatile memory device is further configured to store trimming control codes in the first region as a compensation data set. The trimming control codes are configured to compensate for offsets of the plurality of analog circuits, and are obtained through a wafer-level test on the storage controller. The storage controller, during a power-up sequence, is configured to read the compensation data set from the first region of the at least one nonvolatile memory device, store the read compensation data set therein, and adjust the offsets of the plurality of analog circuits based on the compensation data set stored therein. Each of the trimming control codes corresponds to a control code when each of the plurality of analog circuits provides a corresponding output having a target level during the wafer-level test. The first region corresponds to a single level cell block including a plurality of single level cells, each one of the plurality of single level cells being configured to store a single bit data.

Accordingly, automatic test equipment (ATE) stores trimming control codes that compensate for offsets of the plurality of analog circuits, and are obtained through a wafer-level test on the storage controller, in a single level cell (SLC) block in a nonvolatile memory device instead of an electrical fuse (E-fuse) block in the storage controller, and the storage controller reads the trimming control codes from the SLC block and adjusts the offsets of the analog circuits based on the trimming control codes during a power-up sequence. Therefore, the storage device may reduce a size of the storage controller and may store much information on the analog circuits in the SLC block.

BRIEF DESCRIPTION OF THE DRAWINGS

Illustrative, non-limiting example embodiments will be more clearly understood from the following detailed description in conjunction with the accompanying drawings.

FIG. 20 illustrates signals exchanged between a storage interface of the host and a host interface in the storage device in FIG. 8.

DETAILED DESCRIPTION OF THE EMBODIMENTS

Various example embodiments will be described more fully hereinafter with reference to the accompanying drawings, in which some example embodiments are shown.

Figure 1:
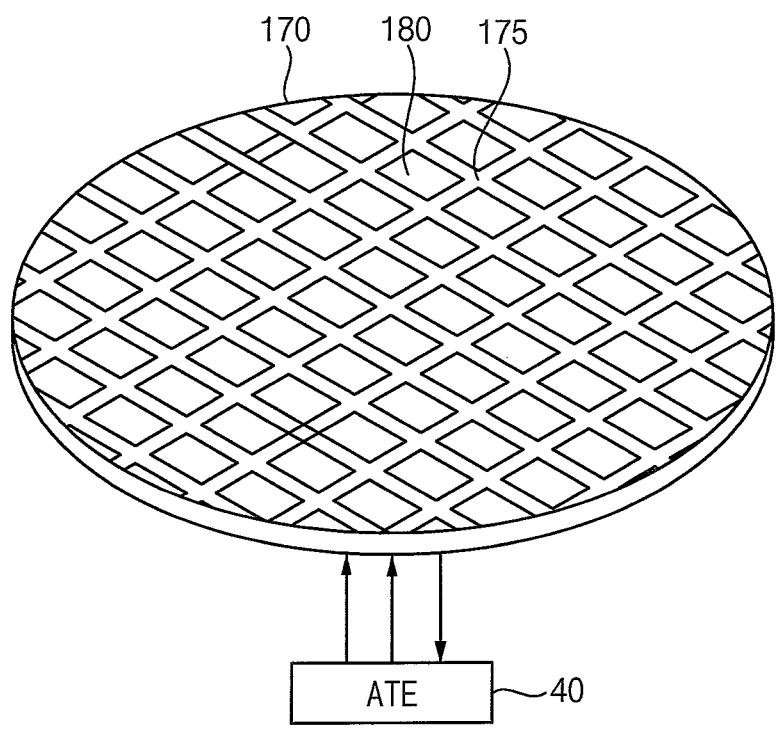
FIG. 1 is a schematic diagram of a wafer on which a plurality of storage controllers are formed according to example embodiments.
Figure 2:
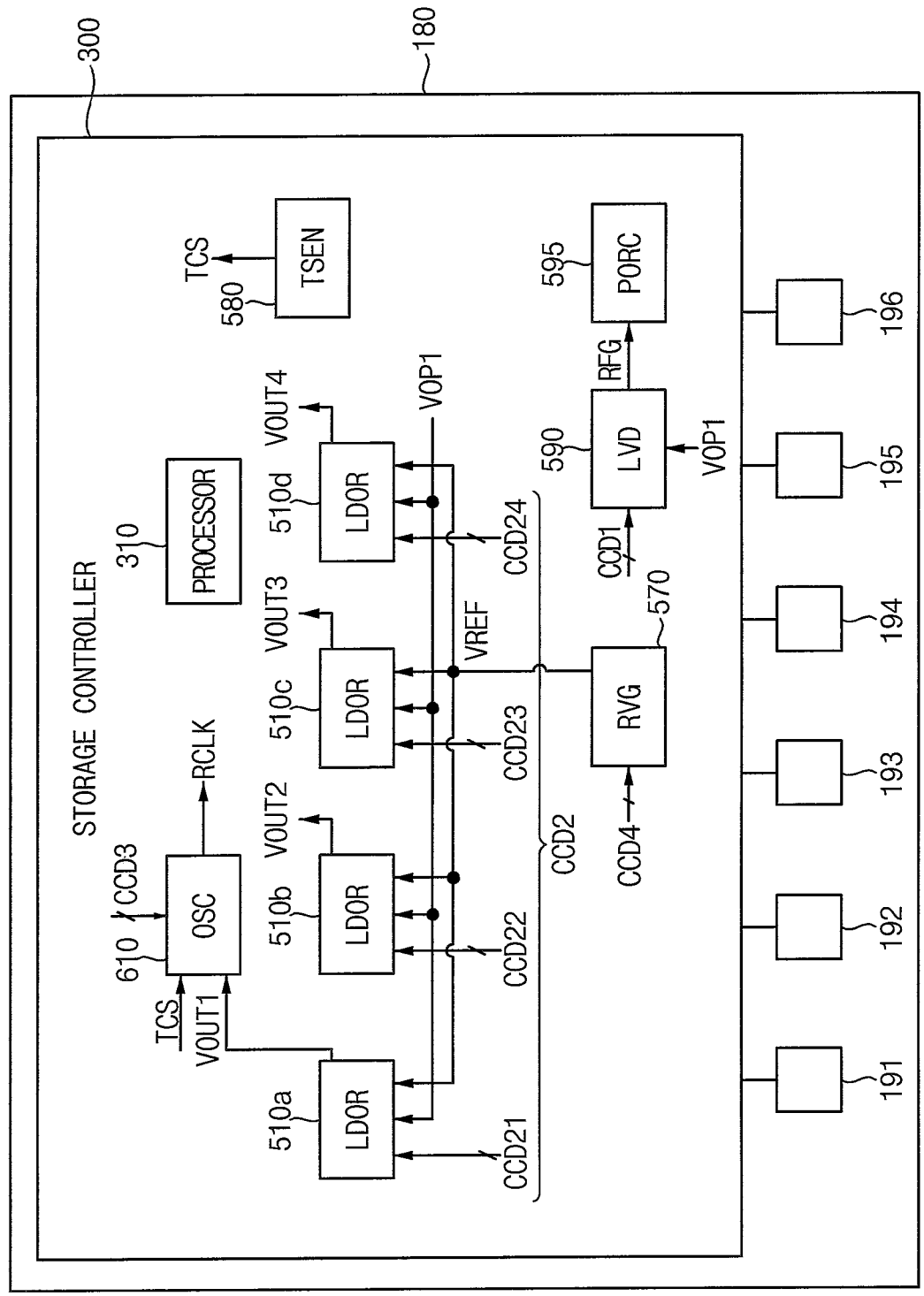
FIG. 2 is an enlarged diagram of a die in a storage controller in FIG. 1 according to example embodiments.

FIG. 1 is a schematic diagram of a wafer on which a plurality of storage controllers are formed according to example embodiments, and FIG. 2 is an enlarged diagram of a die in a storage controller in FIG. 1, according to example embodiments.

Referring to FIGS. 1 and 2, a plurality of dies 180 may be formed on a wafer 170 through a fabrication (FAB) process, and after the plurality of dies 180 are singulated along a scribe line 175, the plurality of dies 180 may be fabricated into individual unit chips or packages through an assembly process.

Between the FAB process and the assembly process, a wafer-level test process or an electric die sorting (EDS) process, in which electrical characteristics of a storage controller (e.g., storage controller 300 in FIG. 2) formed in each of the plurality of dies 180 are tested, may be performed. The wafer-level testing process may be a process in which test operation signals are applied to a die 180 formed on the wafer 170, and the process may determine whether the die 180 has a defect by a test result signal output by the die 180 in response to the test operation signals.

An automatic test equipment (ATE) 40 may provide the test operation signals, transfer the test operation signals to the die 180 via a probe card, and may determine whether the die 180 is defective by receiving the test result signal in response to the test operation signals from the die 180 via the probe card.

Each of the dies 180 may include test pads (e.g., test pads 191-196 in FIG. 2) thereon, which support the wafer-level test. When the probe card physically and electrically contacts the test pads 191-196, the die 180 may perform the test mode in response to the test operation signals. In this case, an electrostatic discharge (ESD) or noise may be induced via the test pads 191-196.

Referring to FIG. 2, the die 180 may include at least one or more test pads 191-196 and the storage controller 300.

The test pad 191 may receive a test enable signal and the test pads 192-196 may receive test operation signals the test operation signals may be applied to the storage controller 300. The test operation signals may include a test clock signal, a test command signal, a test pattern signal, etc. for controlling operations of the storage controller 300. The die 180 may be connected to the ATE 40 having a probe through the test pads 191-196 for performing the wafer-level test.

The storage controller 300 may include a plurality of analog circuits, a processor 310, a power-on reset circuit (PORC) 595, and a temperature sensor (TSEN) 580. The plurality of analog circuits may include a low voltage detector (LVD) 590, a plurality of low drop-out (LDO) regulators (LDORs) 510a, 510b, 510c, and 510d, an oscillator (OSC) 610, and a reference voltage generator (RVG) 570.

The low voltage detector 590 may receive a first operating voltage VOP1 from the ATE 40, may generate a reset flag RFG in response to a voltage level of the first operating voltage VOP1 being smaller (e.g., lower) than a reference level, and may provide the reset flag RFG to the power-on reset circuit 595. The low voltage detector 590 may adjust the reference level in response to a first control code CCD1.

The power-on reset circuit 595 may reset the low voltage detector (LVD) 590, the LDO regulators 510a, 510b, 510c, and 510d, the oscillator 610, and the reference voltage generator 570 in response to the reset flag RFG.

The LDO regulators 510a, 510b, 510c, and 510d may regulate the first operating voltage VOP1 based on at least one reference voltage VREF to generate a plurality of output voltages VOUT1, VOUT2, VOUT3, and VOUT4. Each of the LDO regulators 510a, 510b, 510c, and 510d may adjust a level of a respective one of the output voltages VOUT1, VOUT2, VOUT3, and VOUT4 based on respective one of sub control codes CCD21, CCD22, CCD23, and CCD24, included in a second control code CCD2.

The oscillator 610 may generate a reference clock signal RCLK associated with an operating frequency of the processor 310 based on one VOUT1 of the plurality of output voltages VOUT1, VOUT2, VOUT3, and VOUT4. The oscillator 610 may adjust a frequency of the reference clock signal RCLK based on a third control code CCD3.

The reference voltage generator 570 may generate the at least one reference voltage VREF, and may provide the at least one reference voltage VREF to the LDO regulators 510a, 510b, 510c, and 510d. The reference voltage generator 570 may adjust a level of the at least one reference voltage VREF based on a fourth control code CCD4.

During an ESD test on the die 180, the ATE 40 in FIG. 1 may obtain the first through fourth control codes CCD1, CCD2, CCD3, and CCD4 as trimming control codes for compensating for offsets of the low voltage detector 590, the LDO regulators 510a, 510b, 510c, and 510d, the oscillator 610, and the reference voltage generator 570 in response to each of the low voltage detector 590, the LDO regulators 510a, 510b, 510c, and 510d, the oscillator 610, and the reference voltage generator 570 providing a corresponding output having a target level in response to varying respective one of the first through fourth control codes CCD1, CCD2, CCD3, and CCD4 by sweeping the first through fourth control codes CCD1, CCD2, CCD3, and CCD4. The trimming control codes may be stored as a compensation data set in a single level cell (SLC) region in a nonvolatile memory device that is assembled with the storage controller 300.

When the storage controller 300 passes a wafer-level test, and after the storage controller 300 is assembled with the nonvolatile memory device, the storage controller 300, or the processor 310, during a power-up sequence, may read the compensation data set from the SLC region, may store the read compensation data set therein (e.g., stored inside of the storage controller 300), and may adjust the offsets of the low voltage detector 590, the LDO regulators 510a, 510b, 510c, and 510d, the oscillator 610, and the reference voltage generator 570 to output a voltage having a target level or a clock signal having a target frequency.

Figure 3:
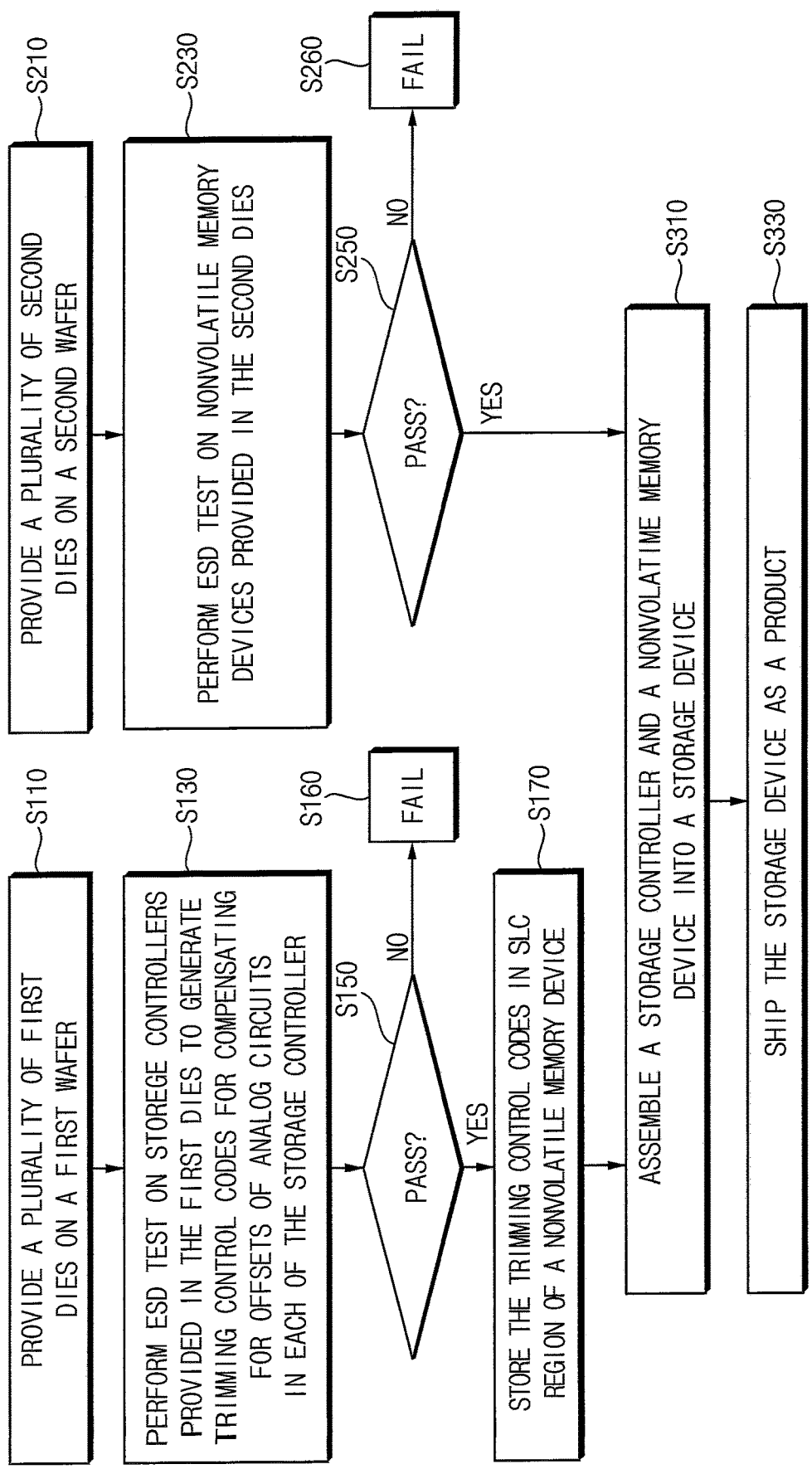
FIG. 3 is a flow chart illustrating fabrication process of a storage device according to example embodiments.

FIG. 3 is a flow chart illustrating fabrication process of a storage device according to example embodiments.

Referring to FIGS. 1 through 3, a plurality of first dies 180 are provided on a first wafer 170 (operation S110). The ATE 40 performs an ESD test on each of the storage controllers 300 provided in the first dies 180 to generate trimming control codes for compensating for offsets of analog circuits in each of the storage controllers 300 (operation S130).

The ATE 40 determines whether each of the first dies 180 based on a result of the ESD test (operation S150).

In parallel with the operations S110, S130, and S150, a plurality of second dies are provided on a second wafer (operation S210). An ATE performs an ESD test on each of a plurality of nonvolatile memory devices provided in the second dies (operation S230). The ATE determines whether each of the second dies based on a result of the ESD test (operation S250).

When a first die does not pass the ESD test (NO in operation S150), the corresponding first die is processed as a failed die (operation S160). When the first die passes the ESD test (YES in operation S150), the trimming control codes is stored as a compensation data set in a first region corresponding to an SLC region of an associated nonvolatile memory device which will be assembled with a storage controller in the first corresponding die (operation S170).

When a second die does not pass the ESD test (NO in operation S250), the corresponding second die is processed as a failed die (operation S260). When the second die passes the ESD test (YES in operation S250), the corresponding nonvolatile memory device and the associated storage controller are assembled into a storage device (operation S310). The storage device may be shipped as a product (operation S330).

Each of the first dies 180 may have a different characteristic based on a relative location in the first wafer 170, and thus, each of the storage controller 300 may have a different process variance based on a location of an associated die in the first wafer 170.

During the ESD test on each of the storage controller 300, the ATE 40 may determine the trimming control codes associated with control codes to render the analog circuit to output voltages and a frequency having target levels, and the ATE 40 may store the trimming control codes in the SLC region of the nonvolatile memory device as the compensation data set. During a real operation, when the storage controller 300 operates the analog circuits based on the compensation data set, the analog circuits in each of the storage controllers 300 provided in the first dies 180 may output voltages and a frequency having the same target levels without regard to the relative location of the first die 180 in the wafer 170.

In addition, because the trimming control codes are stored in the SLC region of the nonvolatile memory device, more information may be stored in the SLC region than a case when the trimming control codes are stored in the E-fuse block in the storage controller and the trimming control codes may be easily updated. In addition, when codes, stored in a read-only memory (ROM) in the storage controller 300 are to be changed, the code values to be changed may be stored in the SLC region, and thus performance of the storage device may be enhanced.

Figure 4:
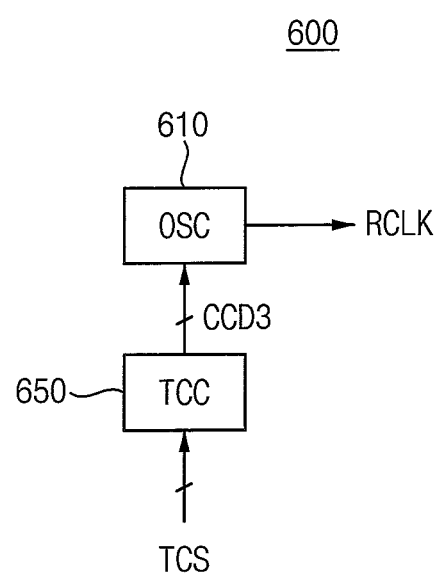
FIG. 4 is a block diagram illustrating a clock generation circuit including an oscillator included in the storage controller in FIG. 2 according to example embodiments.

FIG. 4 is a block diagram illustrating a clock generation circuit including an oscillator included in the storage controller in FIG. 2 according to example embodiments.

Referring to FIG. 4, a clock generation circuit 600 may include an oscillator OSC 610 and a temperature compensation circuit TCC 650.

The temperature compensation circuit 650 may receive an operating temperature code TCS corresponding to an operating temperature to generate the third control code CCD3 varying according to the operating temperature based on a reference temperature code and the operating temperature code TCS. The reference temperature code may be determined through a test operation of the storage controller in which the clock generation circuit 600 is integrated. The operating temperature code TCS may be provided from the temperature sensor 580 in FIG. 2.

The oscillator 610 may generate the reference clock signal RCLK having an operating frequency based on the third control code CCD3 such that the operating frequency is uniform regardless of the operating temperature.

In general, the oscillator 610 may have a particular temperature characteristic, for example, a proportional to absolute temperature (PTAT) characteristic or a complementary to absolute temperature (CTAT) characteristic. The temperature compensation circuit 650 may generate the third control code CCD3 that is varied in the direction to counterbalance the temperature characteristic of the oscillator 610.

The clock generation circuit 600 may efficiently reduce the effect of change of the reference clock signal RCLK by generating the third control code CCD3 reflecting the temperature characteristic of the oscillator 610 using the output value of the temperature sensor 580 and controlling the oscillator 610 using the third control code CCD3.

Figure 5:
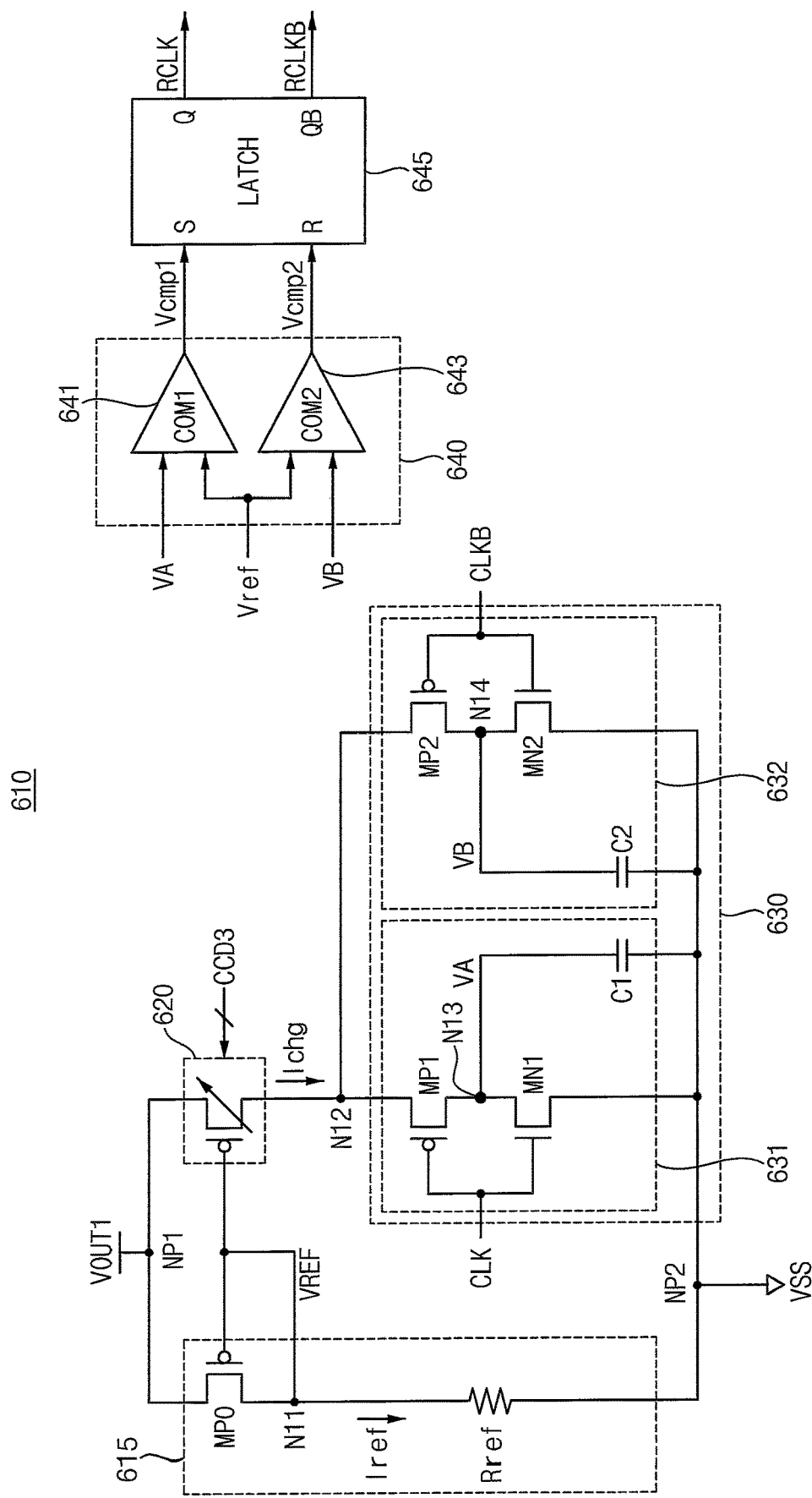
FIG. 5 is a circuit diagram illustrating an example of the oscillator included in a clock generation circuit according to example embodiments.

FIG. 5 is a circuit diagram illustrating an example of the oscillator included in a clock generation circuit according to example embodiments.

Referring to FIG. 5, the oscillator 610 may include a reference current generator 615, a charging current generator 620, a comparison voltage generator 630, a comparing unit 640, and a latch circuit 645.

The reference voltage generator 615 may include a reference p-channel metal-oxide semiconductor (PMOS) transistor MP0 and a reference resistor Rref. The reference PMOS transistor MP0 may be connected between a first power node NP1 to which a regulator voltage VREG is applied and a first node N11. The reference resistor Rref may be connected between the first node N11 and a second power node NP2 to which a ground voltage VSS is applied.

The gate electrode and the drain electrode of the reference PMOS transistor MP0 may be connected electrically. The reference current generator 615 may generate a reference current Iref through the first node N11 and the voltage on the first node N11 may be provided as a reference voltage Vref.

The charging current generator 620 may be connected between the first power node NP1 and a second node N12. The charging current generator 620 may be biased with the reference voltage VREF. The reference PMOS transistor MP0 and the charging current generator 620 may form a current mirror. The charging current generator 620 may generate a charging current Ichg based on the third control code CCD3.

The comparison voltage generator 630 may be connected between the second node N12 and the second power node NP2.

The comparison voltage generator 630 may include a first inverting unit 631 and a second inverting unit 632. The first inverting unit 631 may receive a clock signal CLK and generate a first comparison voltage VA. The second inverting unit 632 may receive an inverted clock signal CLKB and may generate a second comparison voltage VB. The first comparison voltage VA and the second comparison voltage VB may transition in a manner complementarily to each other.

The first inverting unit 631 may include a first PMOS transistor MP1 and a first n-channel metal-oxide-semiconductor (NMOS) transistor MN1 that are serially connected and operate as inverters. The first inverting unit 631 may also include a first capacitor C1 for delaying a change in voltage level of the first comparison voltage VA.

As illustrated in FIG. 5, the first capacitor C1 is charged by the charging current Ichg. Therefore, the time taken by the first comparison voltage VA to transition from the low level to the high level may be determined by the charging current Ichg and the first capacitor C1.

The structure and operation of the second inverting unit 632 may be similar to the first inverting unit 631. The second inverting unit 632 may include a second PMOS transistor MP2 and a second NMOS transistor MN2 that are serially connected and operate as inverters. The second inverting unit 632 may also include a second capacitor C2 for delaying a change in voltage level of the second comparison voltage VB. As illustrated in FIG. 5, the second capacitor C2 is charged by the charging current Ichg. Therefore, the time taken by the second comparison voltage VA to transition from the low level to the high level may be determined by the charging current Ichg and the second capacitor C2.

In some example embodiments, sizes of the second PMOS transistor MP2 and the second NMOS transistor MN2 may be the same as sizes of the first PMOS transistor MP1 and the first NMOS transistor MN1, respectively. In addition, the capacitance of the second capacitor C2 may be the same as that of the first capacitor C1.

The comparing unit 640 may include a first comparator (COM1) 641 and a second comparator (COM2) 643. The first comparator 641 may output first output voltage Vcmp1 which corresponds to the result of a comparison between the reference voltage VREF and the first comparison voltage VA. When the first comparison voltage VA is lower than the reference voltage VREF, the first comparator 641 outputs the first output voltage Vcmp1 at a low level. When the first comparison voltage VA is greater than or equal to the reference voltage VREF, the first comparator 641 may output the first output voltage Vcmp1 at a high level.

The second comparator 643 may output a second output voltage Vcmp2 which corresponds to the result of a comparison between the reference voltage VREF and the second comparison voltage VB. When the second comparison voltage VB is lower than the reference voltage VREF, the second comparator 643 outputs the second output voltage Vcmp2 at a low level. When the second comparison voltage VB is greater than or equal to the reference voltage VREF, the second comparator 643 may output the second output voltage Vcmp2 at a high level.

The latch circuit 645 latches the first output voltage Vcmp1 and the second output voltage Vcmp2, and may output the reference clock signal RCLK and an inverted reference clock signal RCLKB. In an example embodiment, the latch circuit 645 may be implemented by an set/reset (SR) latch circuit as illustrated in FIG. 5. In this case, the first output voltage Vcmp1 is applied to a first input node S of the latch circuit 645, and the second output voltage Vcmp2 may be applied to a second input node R of the latch circuit 645.

When the voltage levels of the first output voltage Vcmp1 and the second output voltage Vcmp2 are different (e.g., when the first output voltage Vcmp1 is at a high level and the second output voltage Vcmp2 is at a low level), the latch circuit 645 outputs the reference clock signal RCLK at the same level as the first output voltage Vcmp1 through a first output node Q, and may output the inverted reference clock signal RCLKB at the same level as the second output voltage Vcmp2 through a second output node QB.

When the first output voltage Vcmp1 and the second output voltage Vcmp2 are at a low level, the latch circuit 645 may output the reference clock signal RCLK and the inverted reference clock signal RCLKB in the same state as a previous state through the first output node Q and the second output terminal QB, respectively.

Figure 6:
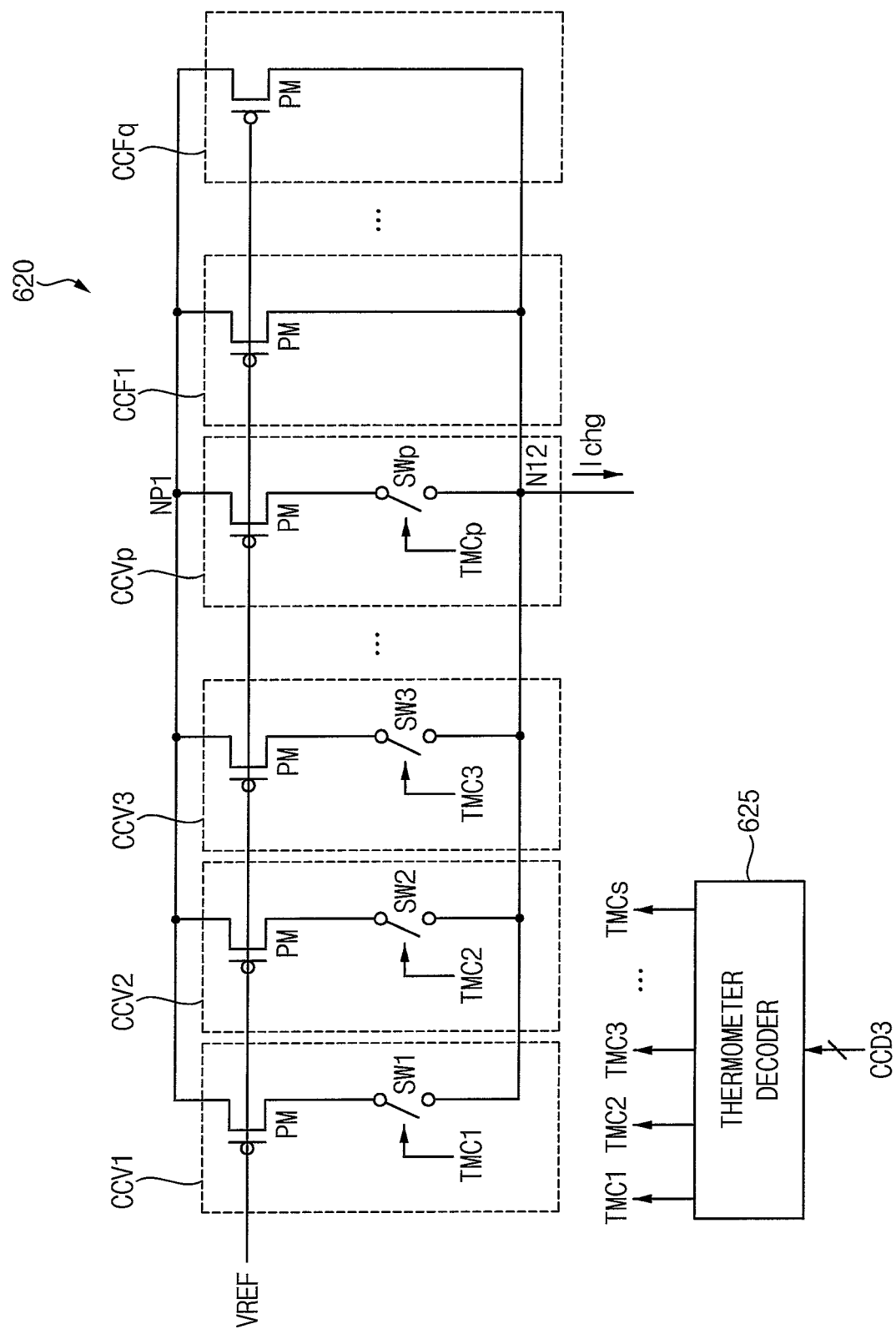
FIG. 6 is a circuit diagram illustrating an example of a charging current generator included in the oscillator of FIG. 5.

FIG. 6 is a circuit diagram illustrating an example of a charging current generator included in the oscillator of FIG. 5.

Referring to FIG. 6, a charging current generator 620 included in the oscillator 610 of FIG. 5 may include variable current cells CCV1-CCVp, one or more fixed current cells CCF1-CCFq and a thermometer decoder 625. In some example embodiments, the thermometer decoder 625 may be disposed outside the oscillator 610, and in this case, the oscillator 610 may receive a thermometer code TMC instead of the third control code CCD3.

The variable current cells CCV1-CCVp and the fixed current cells CCF1-CCFq may be connected in parallel between the first power node NP1 and the second node N12.

The variable current cells CCV1-CCVp may include PMOS transistors PM and switches SW1-SWp, respectively.

The switches SW1-SWp may be turned based on bits TMC1-TMCs of the thermometer code TMC, respectively.

Each of the variable current cells CCV1-CCVp may provide a unit current to the second node N12 when the corresponding switch is turned on.

The fixed current cells CCF1-CCFq may include the PMOS transistors PM, respectively, and each of the fixed current cells CCF1-CCFq may provide the unit current to the second node N12 regardless of the thermometer code TMC.

As such, the charging current Ichg flowing through the second node N12 may be determined based on the unit current, the number of the fixed currents cells and the variable current cells that are turned on. If the sizes of the PMOS transistors PM in FIG. 6 are the same, in other words, if each of the variable current cells CCV1-CCVp and the fixed current cells CCF1-CCFq generates the same unit current, the charging current may be represented by Eq. 1.

$$I_{chg}=(p'+q)\times I_u \qquad [\text{Eq. 1}]$$

In Eq. 1, p' indicates the number of the variable current cells that are turned on, q indicates the number of the fixed current cells, and Iu indicates the unit current.

The thermometer decoder 625 may convert the third control code CCD3 corresponding to a binary code of M bits to the thermometer code TMC of $2^M-1$ bits. In other words, s is equal to $2^M-1$. In some example embodiments, the third control code CCD3 may be determined based on the difference between the measured frequency and the target frequency of the reference clock signal RCLK.

Figure 7:
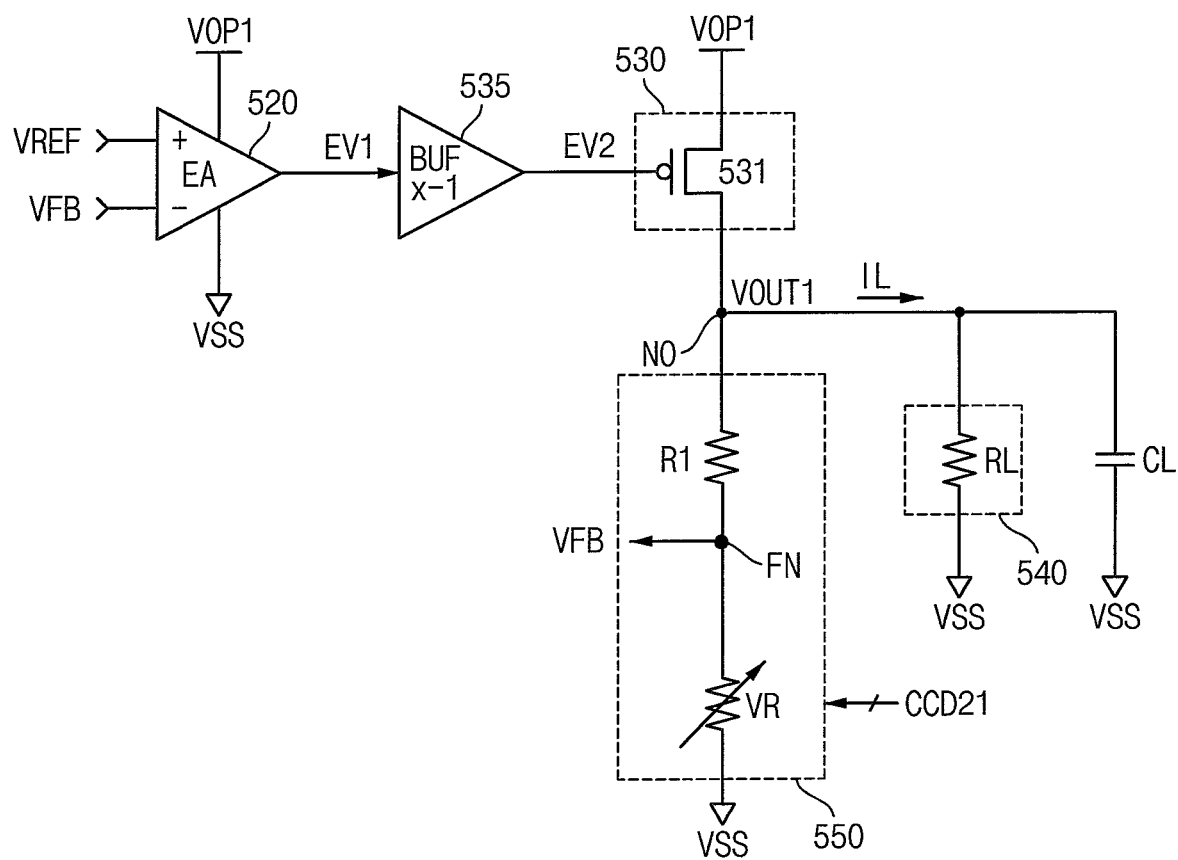
FIG. 7 is a block diagram illustrating one of the low drop-out (LDO) regulators in FIG. 2 according to example embodiments.

FIG. 7 is a block diagram illustrating one of the LDO regulators in FIG. 2 according to example embodiments.

FIG. 7 illustrates a configuration of the LDO regulator 510a and each configuration of the LDO regulators 510b, 510c and 510d may be substantially the same as the configuration of the LDO regulator 510a.

Referring to FIG. 7, the LDO regulator 510a may include an error amplifier (EA) 520, a buffer (BUF) 535, a pass element 530 including a power transistor 531 and a feedback circuit (FC) 550.

In FIG. 7, a load 540 and a load capacitor CL which are connected between an output node NO and the ground voltage VSS are also illustrated. The load capacitor CL is connected between the output node NO and the ground voltage VSS in parallel with respect to the load capacitor CL. The load 540 may include a load resistor RL.

The error amplifier 520 may be connected between the first operating voltage VOP1 and the ground voltage VSS, may receive a reference voltage VREF and a feedback voltage VFB, may compare the reference voltage VREF and the feedback voltage VFB, may amplify a difference between the reference voltage VREF and the feedback voltage VFB based on the comparison to generate a first error voltage EV1 corresponding to the difference, and may output the first error voltage EV1 to the buffer 535.

The first error voltage EV1 may correspond to the difference between the reference voltage VREF and the feedback voltage VFB. The error amplifier 520 has a positive (+) input terminal to receive the reference voltage VREF and a negative (−) input terminal to receive the feedback voltage VFB.

The buffer 535 may buffer the first error voltage EV1 and may output a second error voltage EV2 to a gate of the power transistor 531. The buffer 535 may have a gain of −1.

The power transistor 531 may have a gate receiving the second error voltage EV2, and may regulate the first operating voltage VOP1 based on the second error voltage EV2 to provide the first output voltage VOUT1 to the output node NO. A load current IL corresponding to the first output voltage VOUT1 is provided to the load 540 from the output node NO.

The power transistor 531 has a source coupled to the first operating voltage VOP1, a gate to receive the second error voltage EV2, and a drain coupled to the output node NO. When the load current IL increases, a level of the first output voltage VOUT1 decreases and a level of the first error voltage EV1 increases. A level of the second error voltage EV2 decreases in response to the level of the first error voltage EV1 increasing. When the level of the second error voltage EV2 decreases, the level of the first output voltage VOUT1 increases.

When the load current IL decreases, the level of the first output voltage VOUT1 increases and the level of the first error voltage EV1 decreases. The level of the second error voltage EV2 increases in response to the level of the first error voltage EV1 decreasing. When the level of the second error voltage EV2 increases, the level of the first output voltage VOUT1 decreases.

Therefore, when the load current IL increases, the level of the second error voltage EV2 decreases and when the load current IL decreases, the level of the second error voltage EV2 increases.

The feedback circuit 550 may be connected between the output node NO and the ground voltage VSS, may generate a feedback voltage VFB by dividing the first output voltage VOUT1 and may provide the feedback voltage VFB to the error amplifier 520.

The feedback circuit 550 may include a first resistor R1 and a variable resistor VR connected in series between the output node NO and the ground voltage VSS. The first resistor R1 and the variable resistor VR are connected to each other at a feedback node FN, and the feedback circuit 550 provides the feedback voltage VFB at the feedback node FN.

The variable resistor VR may provide a resistance value varying based on the sub control code CCD21. When the resistance value of the variable resistor VR is varied based on the sub control code CCD21, a voltage level of the first output voltage VOUT1 may be varied. Therefore, the LDO regulator 510a may adjust the voltage level of the first output voltage VOUT1 based on the sub control code CCD21.

Figure 8:
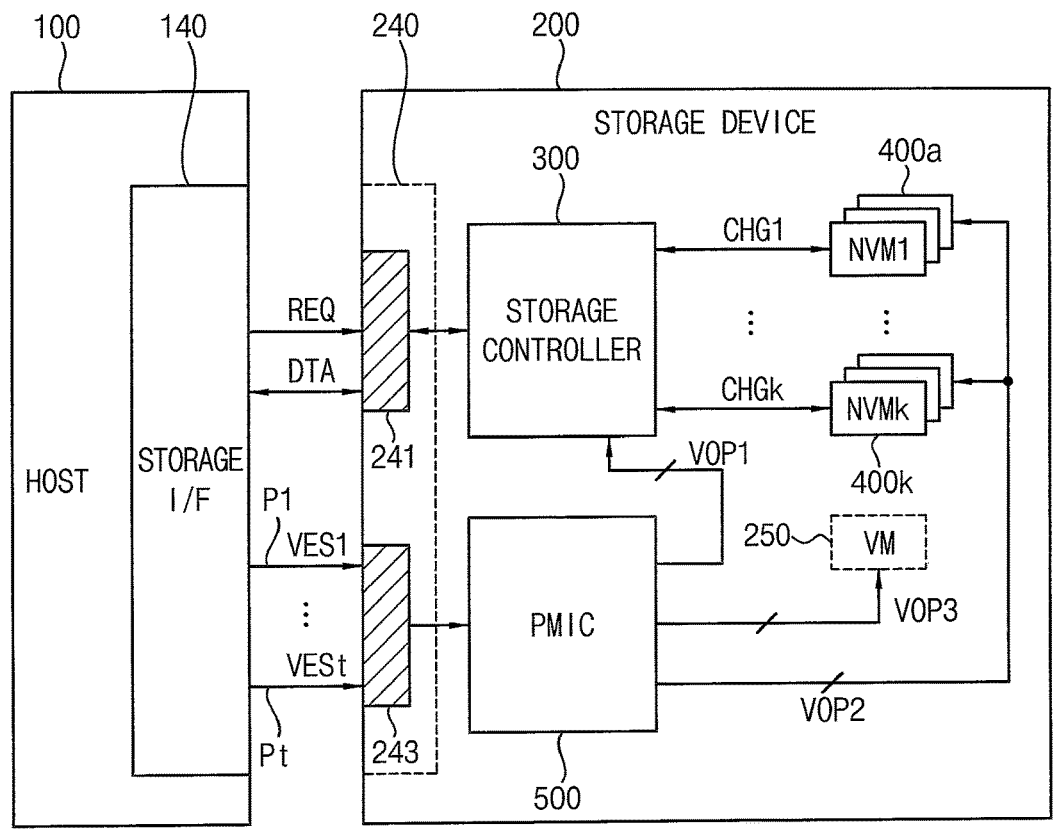
FIG. 8 is a block diagram illustrating a storage system according to example embodiments.

FIG. 8 is a block diagram illustrating a storage system according to example embodiments.

Referring to FIG. 8, a storage system 50 may include a host 100 and a storage device 200. The host 100 may include a storage interface 140.

The storage device 200 may be any kind of storage device.

The storage device 200 may include a storage controller 300, a plurality of nonvolatile memory devices 400a-400k (where k is an integer greater than two), a power management integrated circuit (PMIC) 500, and a host interface 240. The host interface 240 may include a signal connector 241 and a power connector 243. The storage device 200 may further include a volatile memory device 250.

The plurality of nonvolatile memory devices 400a-400k may be used as a storage medium of the storage device 200. In some example embodiments, each of the plurality of nonvolatile memory devices 400a-400k may include a flash memory or a vertical NAND memory device. The storage controller 300 may be coupled to the plurality of nonvolatile memory devices 400a-400k through a plurality of channels CHG1-CHGk, respectively.

The storage controller 300 may be configured to receive a request REQ from the host 100 and communicate data DTA with the host 100 through the signal connector 241. The storage controller 300 may write the data DTA to the plurality of nonvolatile memory devices 400a-400k or read the data DTA from plurality of nonvolatile memory devices 400a-400k based on the request REQ.

The storage controller 300 may communicate the data DTA with the host 100 using the volatile memory device 250 as an input/output buffer. In some example embodiments, the volatile memory device 250 may include a dynamic random access memory (DRAM).

The PMIC 500 may be configured to receive a plurality of power supply voltages (i.e., external supply voltages) VES1-VESt from the host 100 through the power connector 243. For example, the power connector 243 may include a plurality of power lines P1-Pt, and the adaptive power supply circuit 500 may be configured to receive the plurality of power supply voltages VES1-VESt from the host 100 through the plurality of power lines P-Pt, respectively. Here, t represents a positive integer greater than one.

The PMIC 500 may generate at least one first operation voltage VOP1 used by the storage controller, at least one second operation voltage VOP2 used by the plurality of nonvolatile memory devices 400a-400k, and at least one third operation voltage VOP3 used by the volatile memory device 250 based on the plurality of power supply voltages VES1-VESt.

For example, when the PMIC 500 receives all of the plurality of power supply voltages VES1-VESt from the host 100, the PMIC 500 may generate the at least one first operation voltage VOP1, the at least one second operation voltage VOP2, and the at least one third operation voltage VOP3 using all of the plurality of power supply voltages VES1-VESt. Alternatively or additionally, when the PMIC 500 receives less than all of the plurality of power supply voltages VES1-VESt from the host 100, the PMIC 500 may generate the at least one first operation voltage VOP1, the at least one second operation voltage VOP2, and the at least one third operation voltage VOP3 using all of the part (e.g., a portion) of the plurality of power supply voltages VES1-VESt that is received from the host 100.

Figure 9:
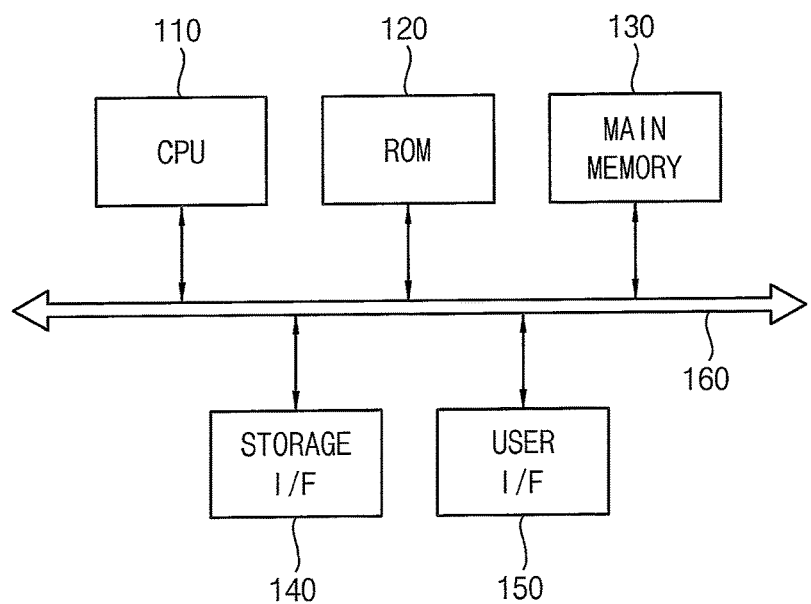
FIG. 9 is a block diagram illustrating the host in FIG. 8 according to example embodiments.

FIG. 9 is a block diagram illustrating the host in FIG. 8 according to example embodiments.

Referring to FIG. 9, the host 100 may include a central processing unit (CPU) 110, a read-only memory (ROM) 120, a main memory 130, a storage interface (I/F) 140, a user interface (I/F) 150 and a bus 160.

The bus 160 may refer to a transmission channel via which data is transmitted between the CPU 110, the ROM 120, the main memory 130, the storage interface 140 and the user interface 150 of the host 100. The ROM 120 may store various application programs. For example, application programs supporting storage protocols such as Advanced Technology Attachment (ATA), Small Computer System Interface (SCSI), embedded Multi Media Card (eMMC), and/or Unix File System (UFS) protocols are stored.

The main memory 130 may temporarily store data or programs. The user interface 150 may be a physical and/or virtual medium for exchanging information between a user and the host device 100, a computer program, etc., and includes physical hardware and/or logical software. For example, the user interface 150 may include an input device for allowing the user to manipulate the host 100, and an output device for outputting a result of processing an input of the user.

The CPU 110 may control overall operations of the host 100. The CPU 110 may generate a command for storing data in the storage device 200 or a request (or a command) for reading data from the storage device 200 using an application stored in the ROM 120, and transmit the request to the storage device 200 via the storage interface 140.

Figure 10:
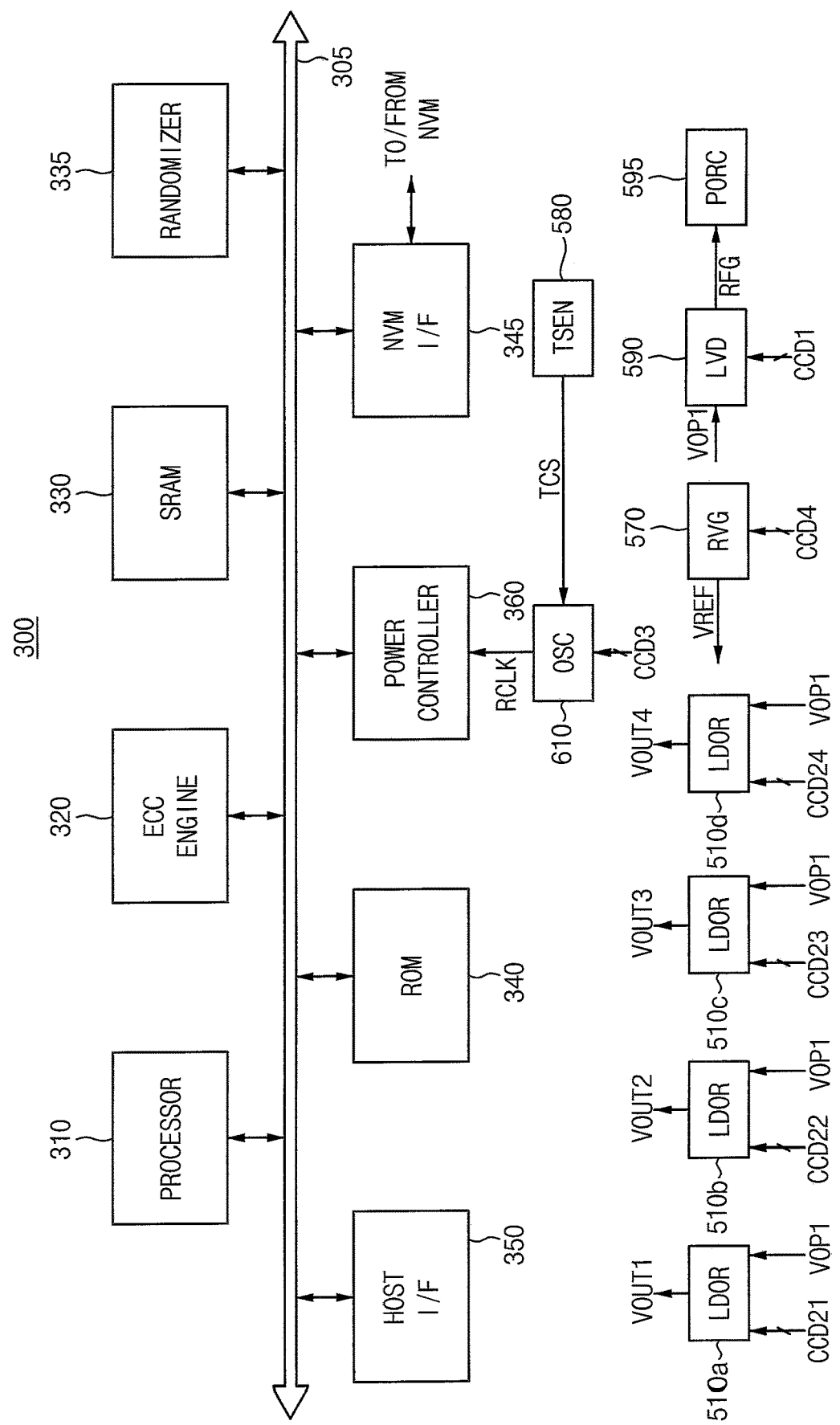
FIG. 10 is a block diagram illustrating an example of the storage controller in FIG. 8 according to example embodiments.

FIG. 10 is a block diagram illustrating an example of the storage controller in FIG. 8 according to example embodiments.

Referring to FIG. 10, the storage controller 300 may include a processor 310, an error correction code (ECC) engine 320, a static random access memory (SRAM) 330, a randomizer 335, a ROM 340, a host interface (I/F) 350, a power controller 360, and a nonvolatile memory (NVM) interface (I/F) 345, which are connected via a bus 305.

The storage controller 300 may further include a plurality of analog circuits such as a low voltage detector 590, a plurality of LDO regulators (LDORs) 510a, 510b, 510c, and 510d, an oscillator 610, and a reference voltage generator (RVG) 570. The storage controller 300 may further include a power-on reset circuit 595 and a temperature sensor 580.

The processor 310 controls an overall operation of the storage controller 300. The processor 310 may include a plurality of cores.

The plurality of cores of the processor 310 may perform control operations associated with the nonvolatile memory devices 400a-400k. At least one of the plurality of cores may process a command provided from the host 100, at least one of the plurality of cores may perform address mapping and garbage collection using a flash translation layer (FTL), and at least one of the plurality of cores may control the nonvolatile memory devices 400a-400k through the nonvolatile controller 345.

Memory cells of the nonvolatile memory devices 400a-400k may have the physical characteristic that a threshold voltage distribution varies due to causes, such as a program elapsed time, a temperature, program disturbance, read disturbance and etc. For example, data stored at the nonvolatile memory devices 400a-400k may become erroneous due to at least one of the above causes.

The storage controller 300 utilizes a variety of error correction techniques to correct such errors. For example, the storage controller 300 may include the ECC engine 320. The ECC engine 320 may correct errors which occur in the data stored in the nonvolatile memory devices 400a-400k.

The ROM 340 stores a variety of information, needed for the storage controller 300 to operate, in firmware, etc. The SRAM 330 may store data provided from the nonvolatile memory devices 400a-400k.

The randomizer 335 randomizes data to be stored in the nonvolatile memory devices 400a-400k. For example, the randomizer 335 may randomize data to be stored in the nonvolatile memory devices 400a-400k in a unit of a word-line.

Data randomizing may refer to processing data such that program states of memory cells connected to a word-line have the same ratio.

For example, if memory cells connected to one word-line are multi-level cells (MLC) each storing 2-bit data, each of the memory cells has one of an erase state and first through third program states.

In this case, the randomizer 335 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored may have program states of which the number is equal to one another.

The randomizer 335 de-randomizes data read from the nonvolatile memory devices 400a-400k.

The host interface 350 may perform interfacing between the host 100 and the nonvolatile memory devices 400a-400k.

The power controller 360 may select one of a plurality of initializing modes based on information of the host 100, and may perform a power throttling to adjust power level consumed in the initializing operation associated with the selected initializing mode.

The nonvolatile memory interface 345 may control the nonvolatile memory devices 400a-400k based on the request REQ.

The low voltage detector 590 may receive the first operating voltage VOP1 from the PMIC 500, may generate a reset flag RFG in response to a voltage level of the first operating voltage VOP1 being smaller than a reference level and may provide the reset flag RFG to the power-on reset circuit 595. The low voltage detector 590 may adjust the reference level in response to the first control code CCD1.

The power-on reset circuit 595 may reset the low voltage detector (LVD) 590, the LDO regulators 510a, 510b, 510c, and 510d, the oscillator 610, and the reference voltage generator 570, in response to the reset flag RFG.

The LDO regulators 510a, 510b, 510c, and 510d may regulate the first operating voltage VOP1 based on at least one reference voltage VREF to generate the plurality of output voltages VOUT1, VOUT2, VOUT3, and VOUT4. Each of the LDO regulators 510a, 510b, 510c, and 510d may adjust a level of a respective one of the output voltages VOUT1, VOUT2, VOUT3, and VOUT4 based on respective one of sub control codes CCD21, CCD22, CCD23, and CCD24 included in a second control code CCD2.

The oscillator 610 may generate the reference clock signal RCLK associated with an operating frequency of the processor 310 based on one VOUT1 of the plurality of output voltages VOUT1, VOUT2, VOUT3, and VOUT4. The oscillator 610 may adjust a frequency of the reference clock signal RCLK based on a third control code CCD3.

The reference voltage generator 570 may generate the at least one reference voltage VREF and may provide the at least one reference voltage VREF to the LDO regulators 510a, 510b, 510c, and 510d. The reference voltage generator 570 may adjust a level of the at least one reference voltage VREF based on a fourth control code CCD4. The reference voltage generator 570 may have a configuration similar with the feedback circuit 550 in FIG. 7.

Figure 11:
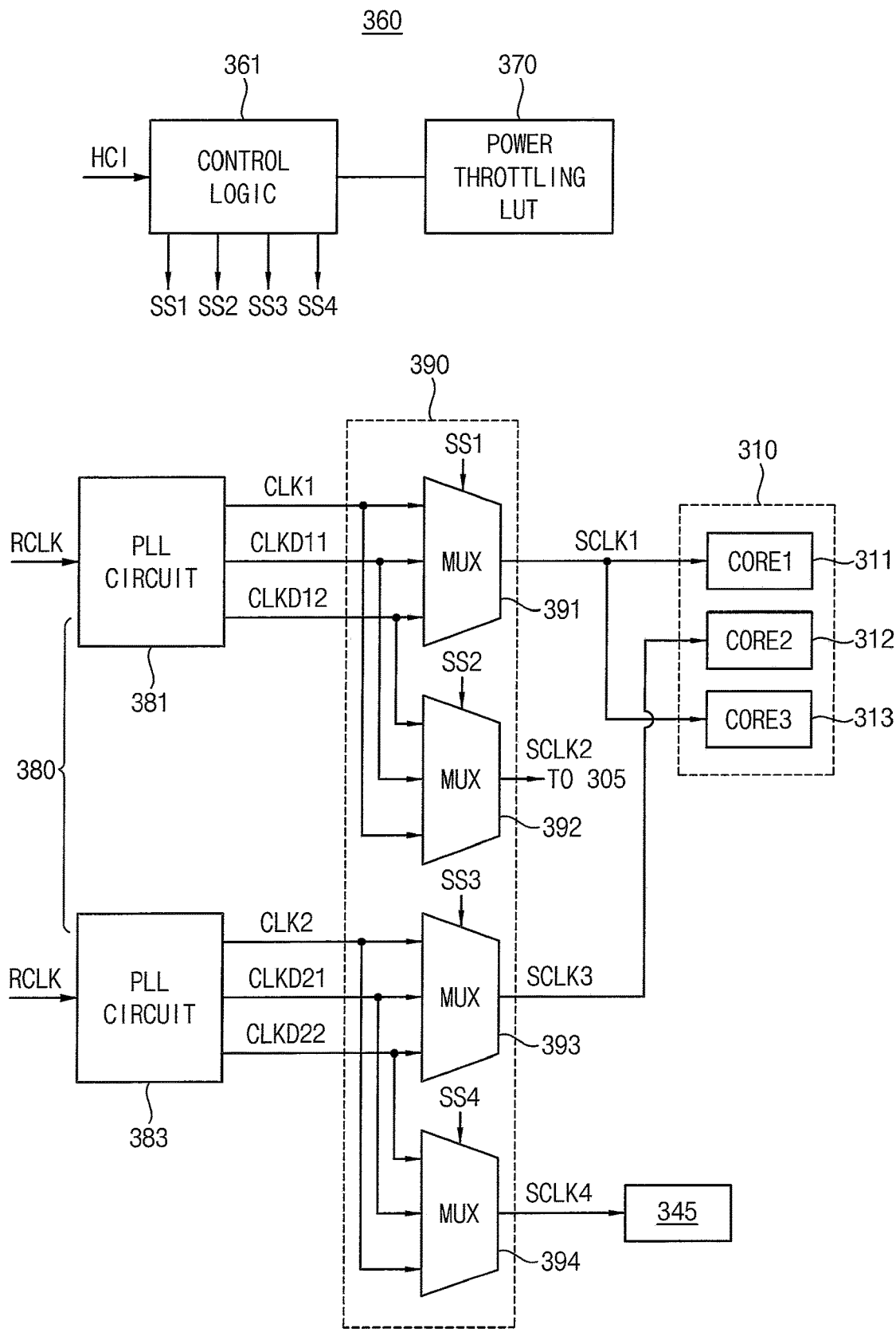
FIG. 11 illustrates an example of the power controller in the storage controller of FIG. 10 according to example embodiments.

FIG. 11 illustrates an example of the power controller in the storage controller of FIG. 10 according to example embodiments.

Referring to FIG. 11, the power controller 360 may include a control logic 361, a power throttling look-up table (LUT) 370, a clock generator 380, and a selection circuit 390.

The clock generator 380 may include phase-locked loop (PLL) circuits 381 and 383, and the selection circuit 390 may include multiplexers 391, 392, 393, and 394.

In FIG. 11, the processor 310 including a plurality of cores 311, 312, and 313 and the nonvolatile memory interface 345 are also illustrated for convenience of explanation.

The core 311 may process a request provided from the host 100, the core 312 may perform address mapping and garbage collection using FTL, and the core 313 may control the nonvolatile memory devices 400a-400k through the nonvolatile memory interface 345.

The control logic 361 may access the power throttling LUT 370 based on host connection information HCI indicating that the storage controller 300 is connected to the host 100, and may generate selection signals SS1, SS2, SS3, and SS4 by referring to a corresponding power target in the power throttling LUT 370.

The power throttling LUT 370 may store information on power targets associated with a plurality of initializing modes. In example embodiments, the power throttling LUT 370 may store information on frequencies of clock signals provided to the cores 311, 312, and 313, the system bus 305, and the nonvolatile controller 345 in each of the plurality of initializing modes.

The PLL circuit 381 may generate a base clock signal CLK1 having a first frequency and divided clock signals CLKD11 and CLKD12 by dividing the base clock signal CLK1 based on the reference clock signal RCLK.

The PLL circuit 383 may generate a base clock signal CLK2 having a second frequency and divided clock signals CLKD21 and CLKD22 by dividing the base clock signal CLK2 based on the reference clock signal RCLK.

The multiplexer 391 selects one of the base clock signal CLK1 and the divided clock signals CLKD11 and CLKD12 as a first selected clock signal SCLK1 in response to a first selection signal SS1 and provides the first selected clock signal SCLK1 to the cores 311 and 313.

The multiplexer 392 selects one of the base clock signal CLK1 and the divided clock signals CLKD11 and CLKD12 as a second selected clock signal SCLK2 in response to a second selection signal SS2 and provides the second selected clock signal SCLK2 to the system bus 305.

The multiplexer 393 selects one of the base clock signal CLK2 and the divided clock signals CLKD21 and CLKD22 as a third selected clock signal SCLK3 in response to a third selection signal SS3 and provides the third selected clock signal SCLK3 to the core 312.

The multiplexer 394 selects one of the base clock signal CLK2 and the divided clock signals CLKD21 and CLKD22 as a fourth selected clock signal SCLK4 in response to a fourth selection signal SS4 and provides the fourth selected clock signal SCLK4 to the nonvolatile controller 345.

Figure 12:
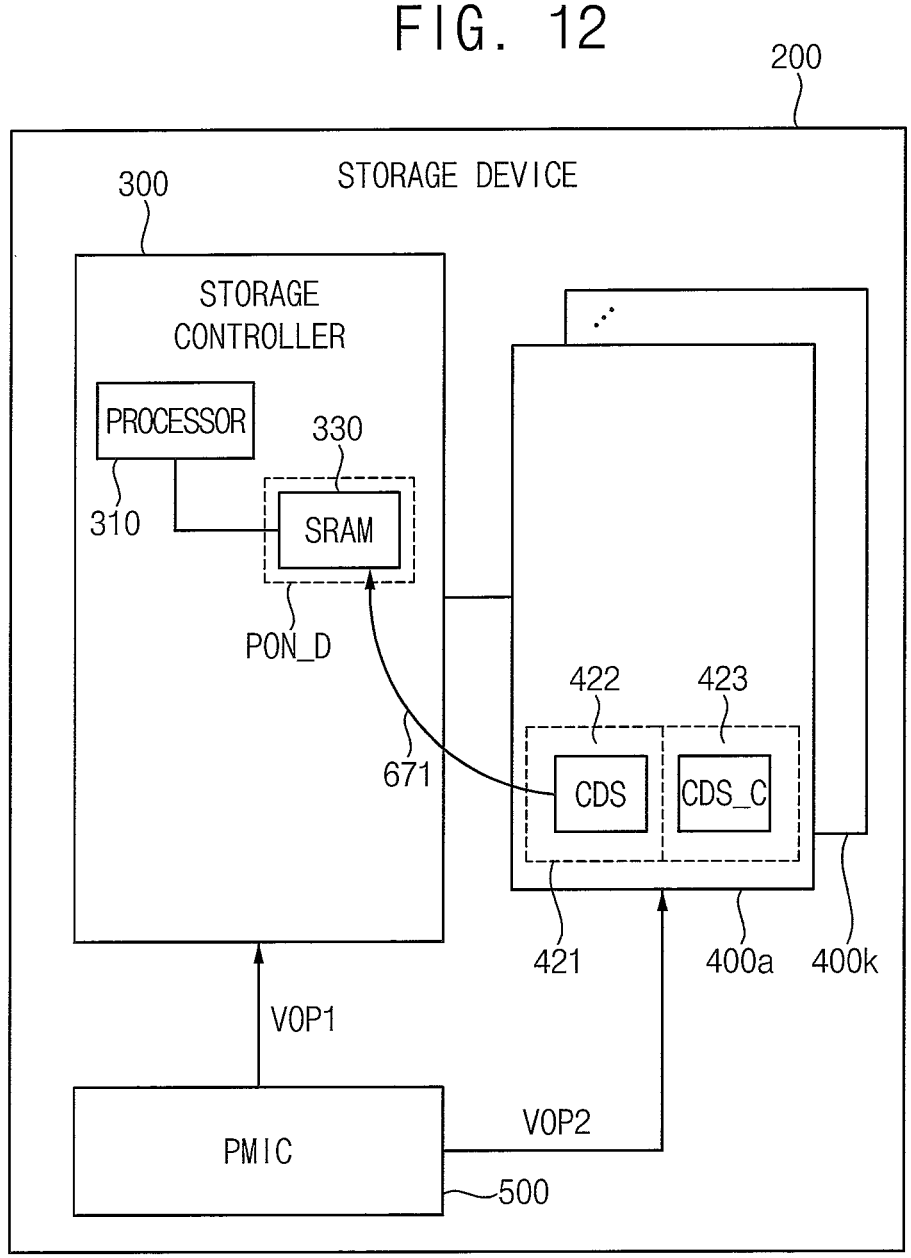
FIG. 12 illustrates an example of a power-up sequence of the storage device of FIG. 8 according to example embodiments.

FIG. 12 illustrates an example of a power-up sequence of the storage device of FIG. 8 according to example embodiments.

Referring to FIG. 12, during a power-up sequence in which power is initially applied to the storage device 200 or the power is applied again to the storage device 200, the storage controller 300 operates at a first speed to read a compensation data set CDS stored in a first region 421 of the nonvolatile memory device 400a and stores the compensation data set CDS in the SRAM 330 in the storage controller 300 as reference numeral 671 indicates. The SRAM 330 may belong to a power-on domain PON_D to which power is provided in a power saving state and in a hibernate state of the storage controller 300.

The storage controller 300 operates at a second speed faster than the first speed to compensate for offsets of outputs of the plurality of analog circuits such as the low voltage detector 590, the plurality of LDO regulators 510a, 510b, 510c, and 510d, the oscillator 610, and the reference voltage generator 570, based on the compensation data set CDS stored in the SRAM 330.

The first region 421 of the nonvolatile memory device 400a may include a main region 422 to store the compensation data set CDS and a replica block 423 to store a copied version CDS_C of the compensation data set CDS. The first region 421 may correspond to a single-level cell (SLC) block including a plurality of SLCs.

Figure 13:
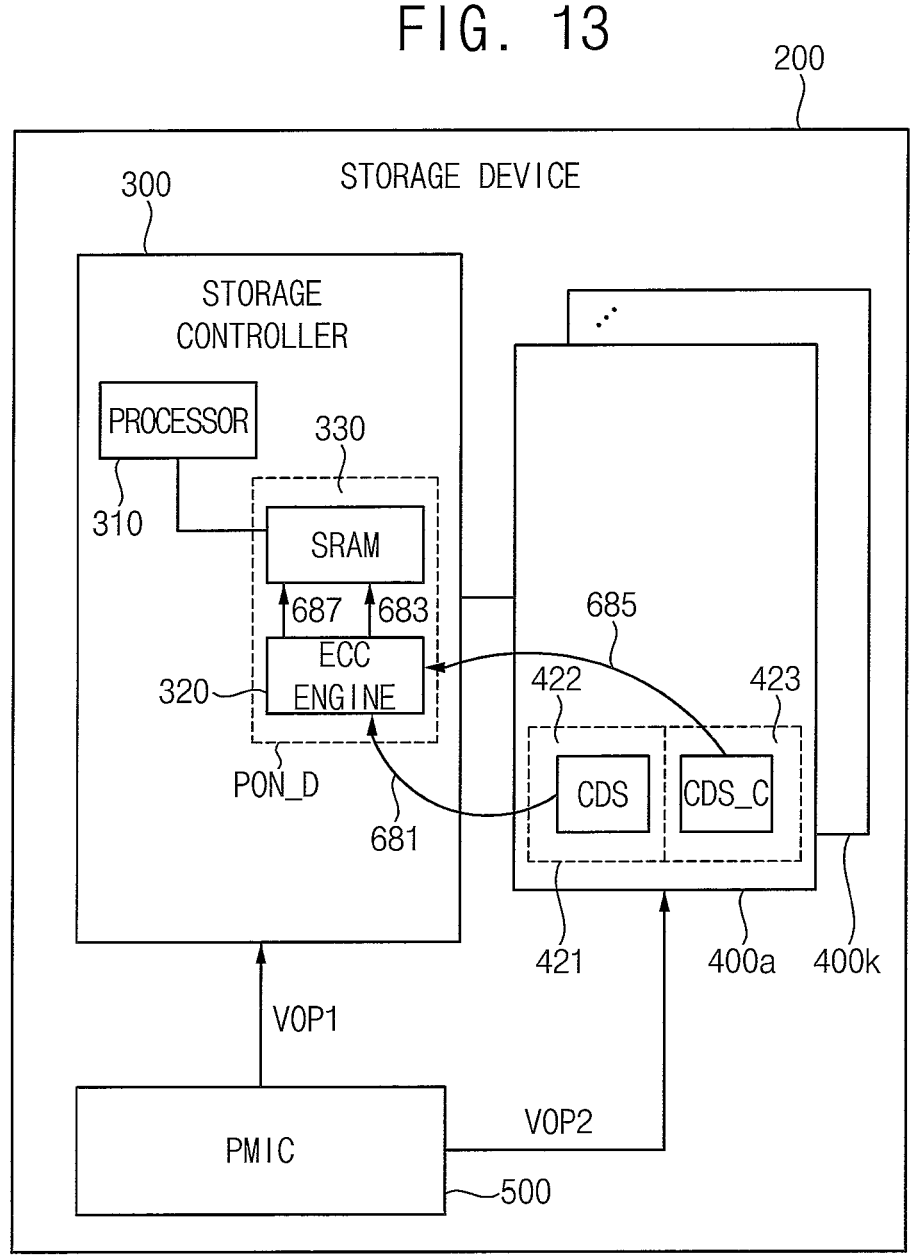
FIG. 13 illustrates an example of a power-up sequence of the storage device of FIG. 8 according to example embodiments.

FIG. 13 illustrates an example of a power-up sequence of the storage device of FIG. 8 according to example embodiments.

Referring to FIG. 13, during a power-up sequence in which power is initially applied to the storage device 200 or the power is applied again to the storage device 200, the storage controller 300 operates at a first speed to read a compensation data set CDS stored in a first region 421 of the nonvolatile memory device 400a and provides the compensation data set CDS to the ECC engine 320 in the storage controller 300 as reference numeral 681 indicates.

The ECC engine 320 performs an ECC decoding on the compensation data set CDS, detects at least one error in the compensation data set CDS, corrects correctable error in the compensation data set CDS, and provides the compensation data set CDS to the SRAM as reference numeral 683 indicates.

In response to the engine 320 detecting uncorrectable errors in the compensation data set CDS, the storage controller 300 operates at the first speed to read a copied version CDS_C of the compensation data set in the replica block 423 and provides the copied version CDS_C of the compensation data set to the ECC engine 320 as reference numeral 685 indicates.

The ECC engine 320 performs an ECC decoding on the copied version CDS_C of the compensation data set, detects at least one error in the copied version CDS_C of the compensation data set, corrects correctable error in the copied version CDS_C of the compensation data set, and provides the copied version CDS_C of the compensation data set to the SRAM as reference numeral 687 indicates.

The SRAM 330 and the ECC engine 320 may belong to a power-on domain PON_D to which power is provided in a power saving state and in a hibernate state of the storage controller 300.

The storage controller 300 operates at a second speed faster than the first speed to compensate for offsets of outputs of the plurality of analog circuits such as the low voltage detector 590, the plurality of LDO regulators 510a, 510b, 510c, and 510d, the oscillator 610, and the reference voltage generator 570 based on the compensation data set CDS or the copied version CDS_C of the compensation data set stored in the SRAM 330.

Figure 14:
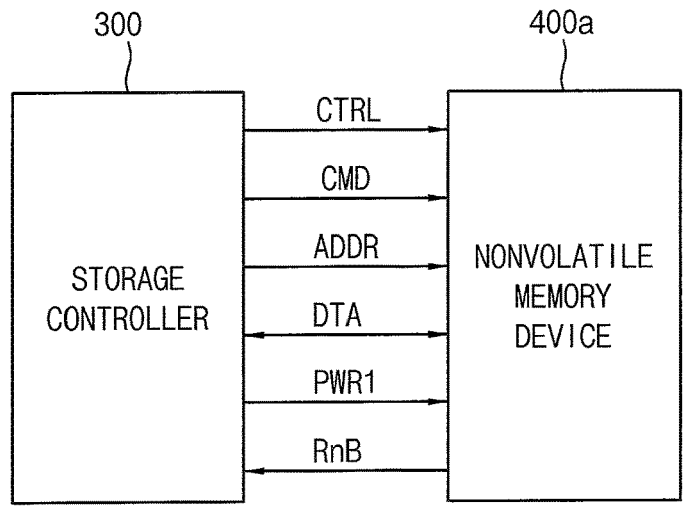
FIG. 14 is a block diagram illustrating a connection relationship between the storage controller and one nonvolatile memory device in the storage device of FIG. 8.

FIG. 14 is a block diagram illustrating a connection relationship between the storage controller and one nonvolatile memory device in the storage device of FIG. 8.

Referring to FIG. 14, the nonvolatile memory device 400a may perform an erase operation, a program operation, and/or a write operation under control of the storage controller 300. The nonvolatile memory device 400a may receive a command CMD, an address ADDR, and (user) data DTA through input/output lines from the storage controller 300 for performing such operations.

In addition, the nonvolatile memory device 411 may receive a control signal CTRL through a control line and receive power PWR through a power line from the storage controller 300. In addition, the nonvolatile memory device 411 may provide a status signal RnB to the storage controller 300 through the control line.

Figure 15:
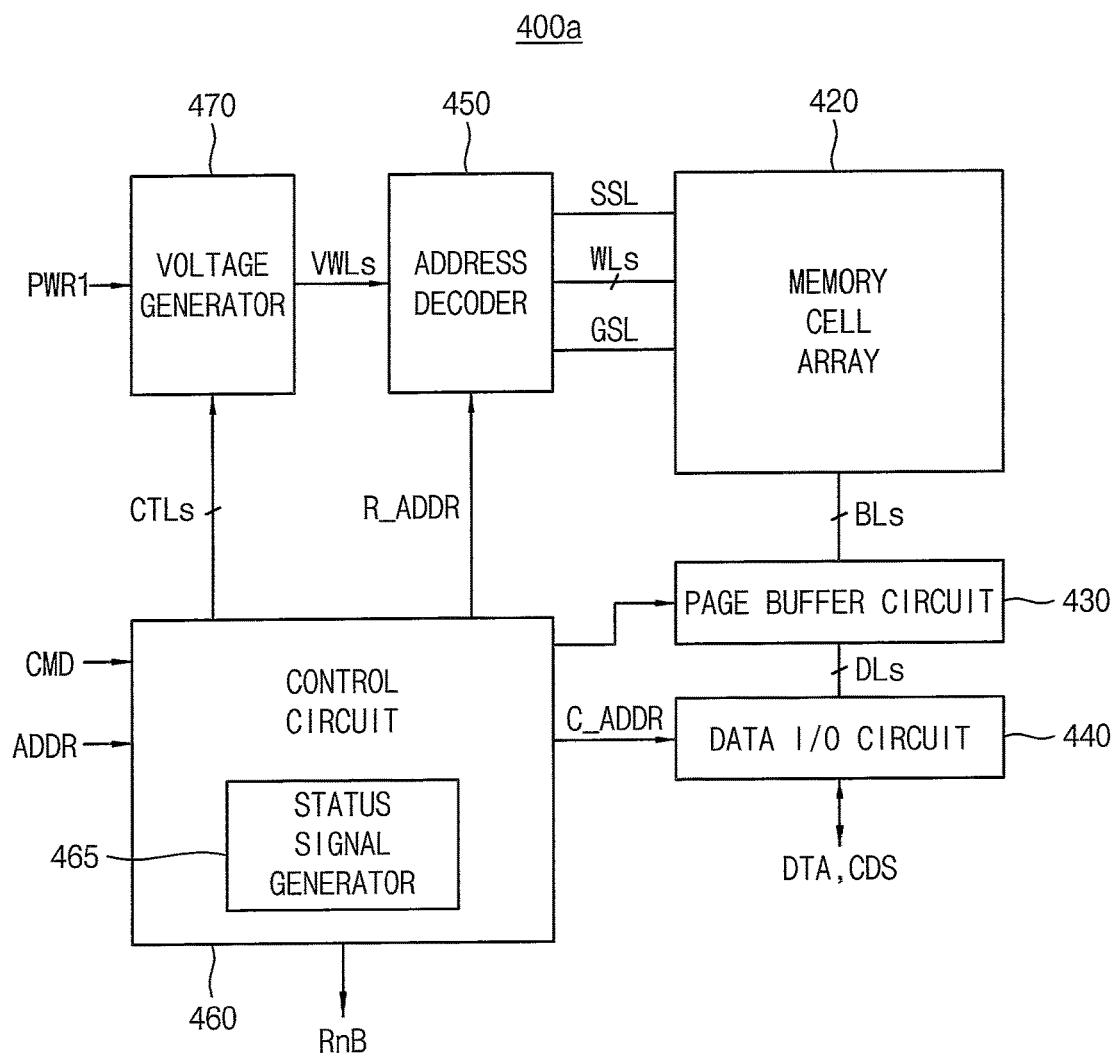
FIG. 15 is a block diagram illustrating the nonvolatile memory device in FIG. 14 according to some example embodiments.

FIG. 15 is a block diagram illustrating the nonvolatile memory device in FIG. 14 according to some example embodiments.

Referring to FIG. 15, the nonvolatile memory device 400a includes a memory cell array 420, an address decoder 450, a page buffer circuit 430, a data input/output circuit 440, a control circuit 460, and a voltage generator 470.

The memory cell array 420 may be coupled to the address decoder 450 through a string selection line SSL, a plurality of word-lines WLs, and a ground selection line GSL. In addition, the memory cell array 420 may be coupled to the page buffer circuit 430 through a plurality of bit-lines BLs.

The memory cell array 420 may include a plurality of memory cells coupled to the plurality of word-lines WLs and the plurality of bit-lines BLs.

In some example embodiments, the memory cell array 420 may be or may include a three-dimensional memory cell array, which is formed on a substrate in a three-dimensional structure (e.g., a vertical structure). In such a case, the memory cell array 420 may include vertical cell strings that are vertically oriented such that at least one memory cell is located over another memory cell.

Figure 16:
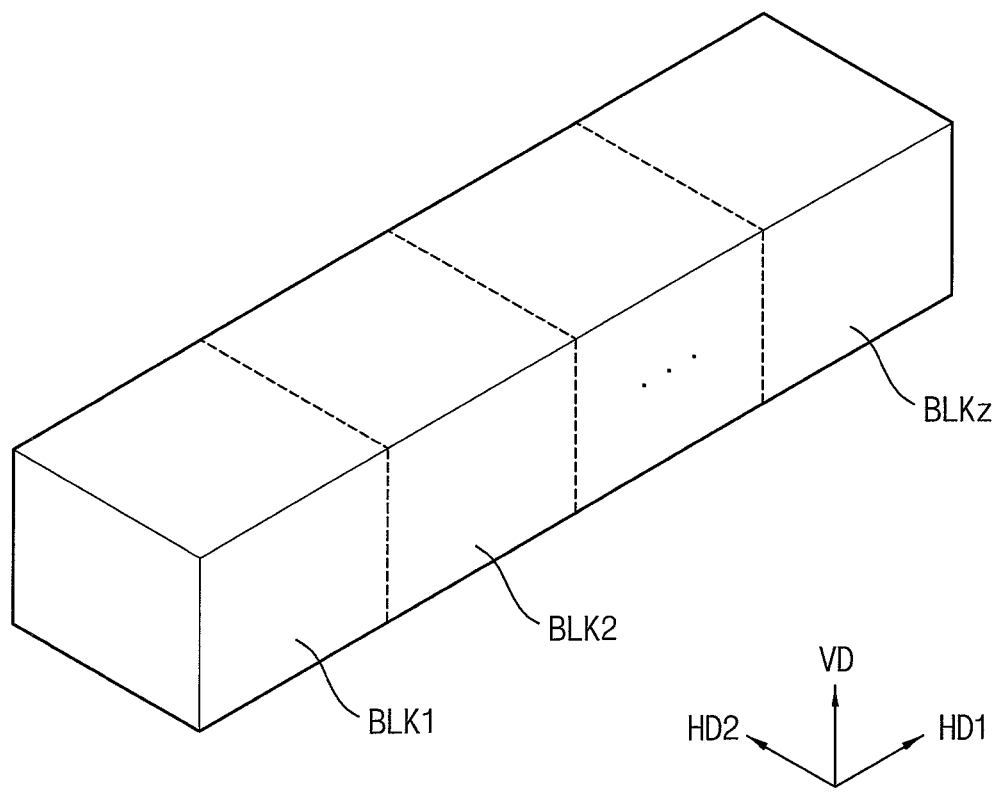
FIG. 16 is a block diagram illustrating the memory cell array in the nonvolatile memory device of FIG. 15.

FIG. 16 is a block diagram illustrating the memory cell array in the nonvolatile memory device of FIG. 15.

Referring to FIG. 16, the memory cell array 420 may include a plurality of memory blocks BLK1 to BLKz. The memory blocks BLK1 to BLKz extend along a first horizontal direction EED1, a second horizontal direction HD2 and a vertical direction VD. In some example embodiments, the memory blocks BLK1 to BLKz are selected by the address decoder 450 in FIG. 15. For example, the address decoder 450 may select a memory block BLK corresponding to a block address among the memory blocks BLK1 to BLKz.

Figure 17:
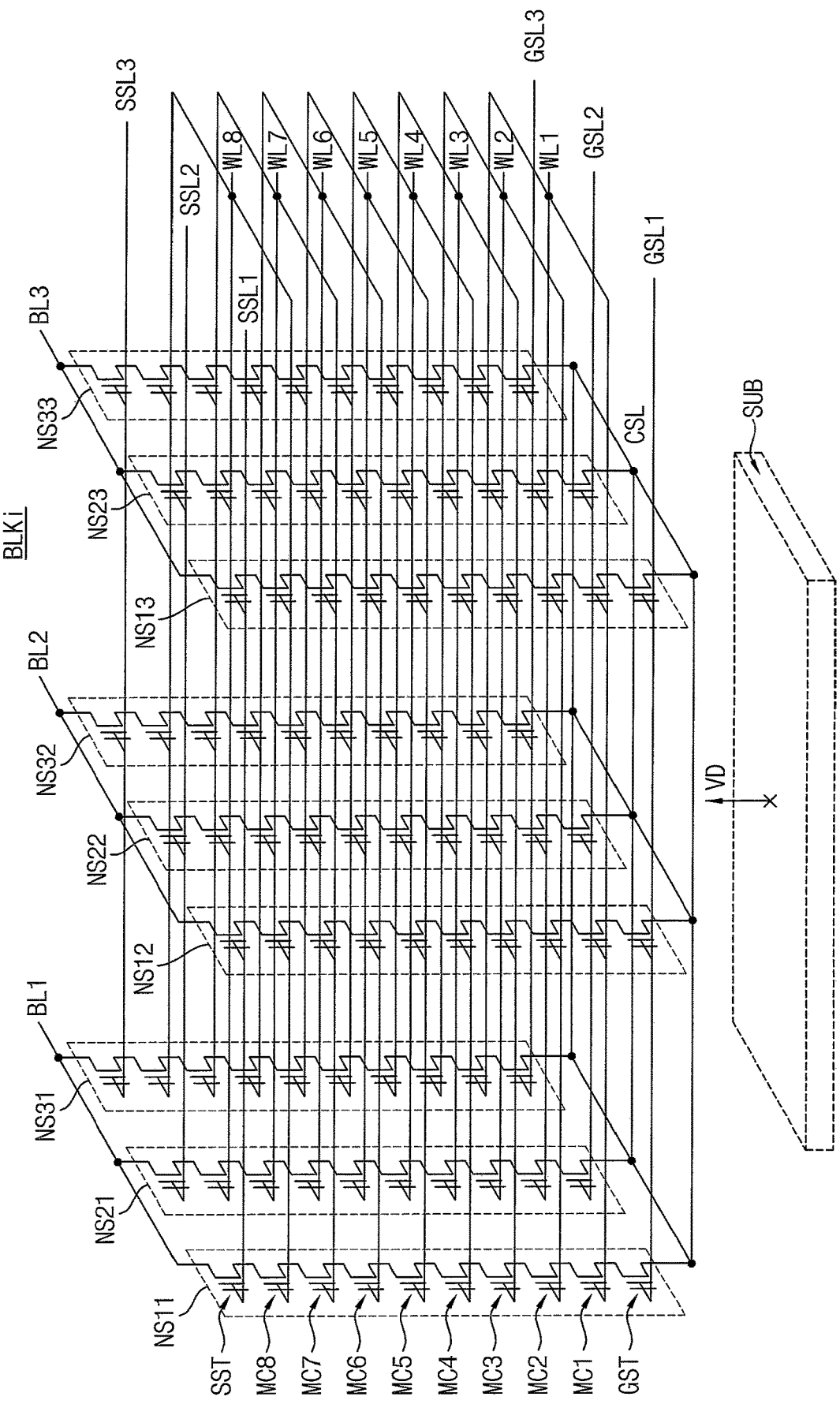
FIG. 17 is a circuit diagram illustrating one of the memory blocks of FIG. 16.

FIG. 17 is a circuit diagram illustrating one of the memory blocks of FIG. 16.

The memory block BLKi of FIG. 17 may be formed on a substrate SUB in a three-dimensional structure (or a vertical structure). For example, a plurality of memory cell strings included in the memory block BLKi may be formed in a direction VD perpendicular to the substrate SUB.

Referring to FIG. 17, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 17, each of the memory cell strings NS11 to NS33 is illustrated to include eight memory cells MC1 to MC8. However, inventive concepts are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1-WL8) having the same height may be commonly connected, and the ground selection lines GSL1 to GSL3 and the string selection lines SSL1 to SSL3 may be separated. In FIG. 17, the memory block BLKi is illustrated to be coupled to eight word-lines WL1 to WL8 and three bit-lines BL1 to BL3. However, inventive concepts are not limited thereto. In some example embodiments, the memory cell array 420 may be coupled to any number of word-lines and bit-lines.

Figure 18:
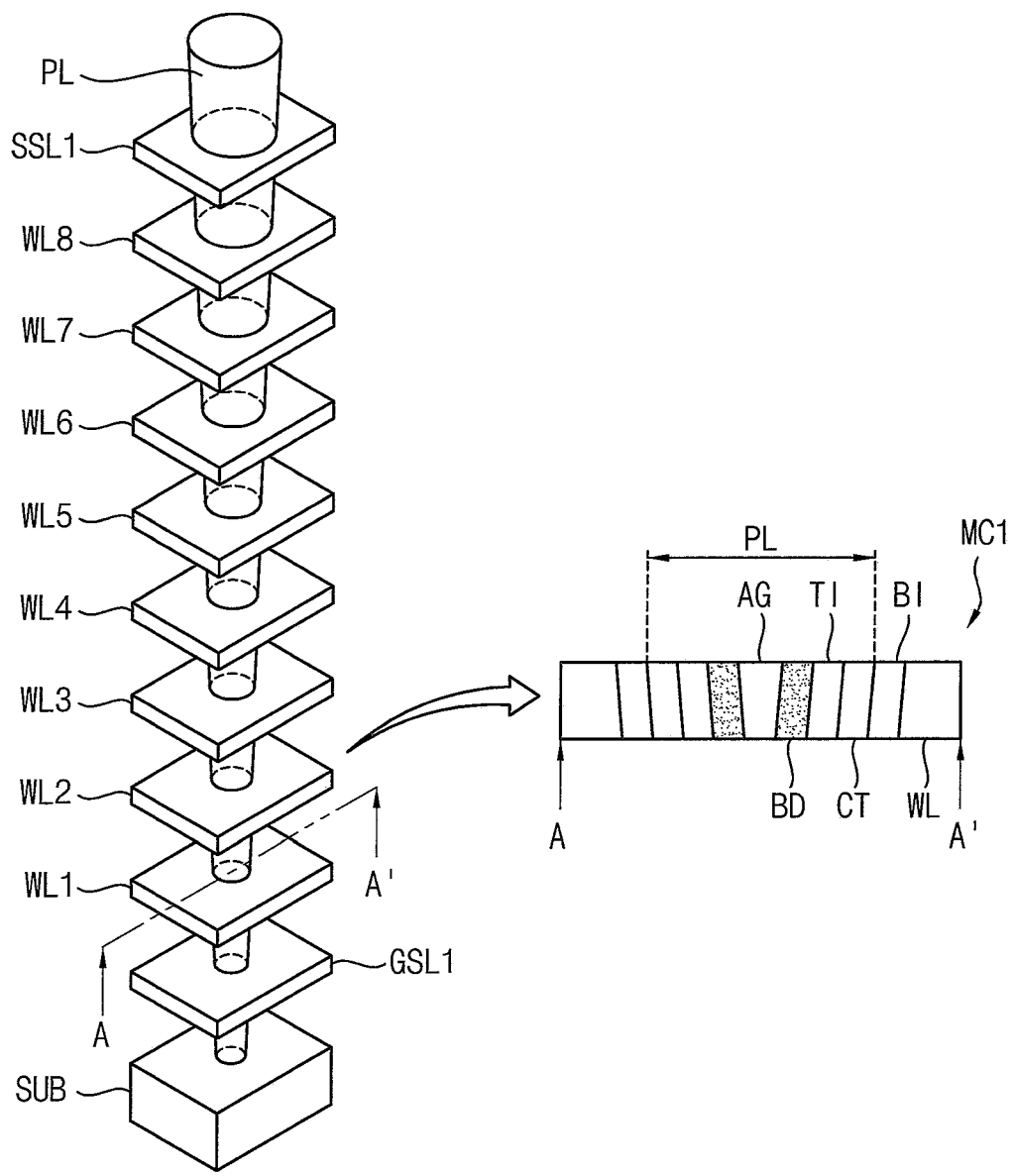
FIG. 18 illustrates an example of a structure of a cell string (CS) in the memory block of FIG. 17.

FIG. 18 illustrates an example of a structure of a cell string (CS) in the memory block of FIG. 17.

Referring to FIGS. 17 and 18, a pillar PL is provided on the substrate SUB such that the pillar PL extends in a direction perpendicular to the substrate SUB to make contact with the substrate SUB. Each of the ground selection line GSL, the word lines WL1 to WL8, and the string selection lines SSL illustrated in FIG. 18 may be formed of a conductive material parallel with the substrate SUB, for example, a metallic material. The pillar PL may be in contact with the substrate SUB through the conductive materials forming the string selection lines SSL, the word lines WL1 to WL8, and the ground selection line GSL.

A sectional view taken along a line A-A' is also illustrated in FIG. 18. In some example embodiments, a sectional view of a first memory cell MC1 corresponding to a first word line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word line WL and the pillar PL. The body BD, the tunnel insulating layer TI, the charge trap layer CT, the blocking insulating layer BI, and the first word line WL may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 15, the control circuit 460 may receive the command (signal) CMD and the address (signal) ADDR from the storage controller 300, and may control an erase loop, a program loop and/or a read operation of the nonvolatile memory device 411 based on the command signal CMD and the address signal ADDR. The program loop may include a program operation and a program verification operation. The erase loop may include an erase operation and an erase verification operation.

For example, the control circuit 460 may generate control signals CTLs, which are used for controlling the voltage generator 470, based on the command signal CMD, and generate a row address R_ADDR and a column address C_ADDR based on the address signal ADDR. The control circuit 460 may provide the row address R_ADDR to the address decoder 450 and provide the column address C_ADDR to the data input/output circuit 440.

The address decoder 450 may be coupled to the memory cell array 420 through the string selection line SSL, the plurality of word-lines WLs, and the ground selection line GSL. During the program operation or the read operation, the address decoder 450 may determine one of the plurality of word-lines WLs as a first word-line (e.g., a selected word-line) and determine the rest of the plurality of word-lines WLs except for the first word-line as unselected word-lines based on the row address R_ADDR.

The voltage generator 470 may generate word-line voltages VWLs, which are required for the operation of the nonvolatile memory device 411, based on the control signals CTLs. The voltage generator 470 may receive a power PWR from the storage controller 300. The word-line voltages VWLs may be applied to the plurality of word-lines WLs through the address decoder 450.

For example, during the erase operation, the voltage generator 470 may apply an erase voltage to a well of the memory block and may apply a ground voltage to entire word-lines of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the first word-line and may apply a program pass voltage to the unselected word-lines. In addition, during the program verification operation, the voltage generator 470 may apply a program verification voltage to the first word-line and may apply a verification pass voltage to the unselected word-lines.

Furthermore, during the read operation, the voltage generator 470 may apply a read voltage to the first word-line and may apply a read pass voltage to the unselected word-lines.

The page buffer circuit 430 may be coupled to the memory cell array 420 through the plurality of bit-lines BLs. The page buffer circuit 430 may include a plurality of page buffers. In some example embodiments, one page buffer may be connected to one bit-line. In some example embodiments, one page buffer may be connected to two or more bit-lines.

The page buffer circuit 430 may temporarily store data to be programmed in a selected page or data read out from the selected page.

The data input/output circuit 440 may be coupled to the page buffer circuit 430 through data lines DLs. During the program operation, the data input/output circuit 440 may receive the data DTA from the storage controller 300 or the compensation data set CDS and provide the data DTA and the compensation data set CDS to the page buffer circuit 430 based on the column address C_ADDR received from the control circuit 460.

During the read operation, the data input/output circuit 440 may provide the data DTA or the compensation data set CDS, which are stored in the page buffer circuit 430, to the storage controller 300 based on the column address C_ADDR received from the control circuit 460.

In addition, the page buffer circuit 430 and the data input/output circuit 440 read data from a first area of the memory cell array 420 and write the read data to a second area of the memory cell array 420. For example, the page buffer circuit 430 and the data input/output circuit 440 may perform a copy-back operation. The control circuit 460 may control the page buffer circuit 430 and data I/O circuit 440.

The control circuit 460 may include a status signal generator 465 and the status signal generator 465 may generate the status signal RnB indicating whether each of the program operation, the erase operation and the read operation is completed or and/or is in progress.

The storage controller 300 may determine idle state or busy state of each of the nonvolatile memory devices 400a-400k based on the status signal RnB.

Figure 19:
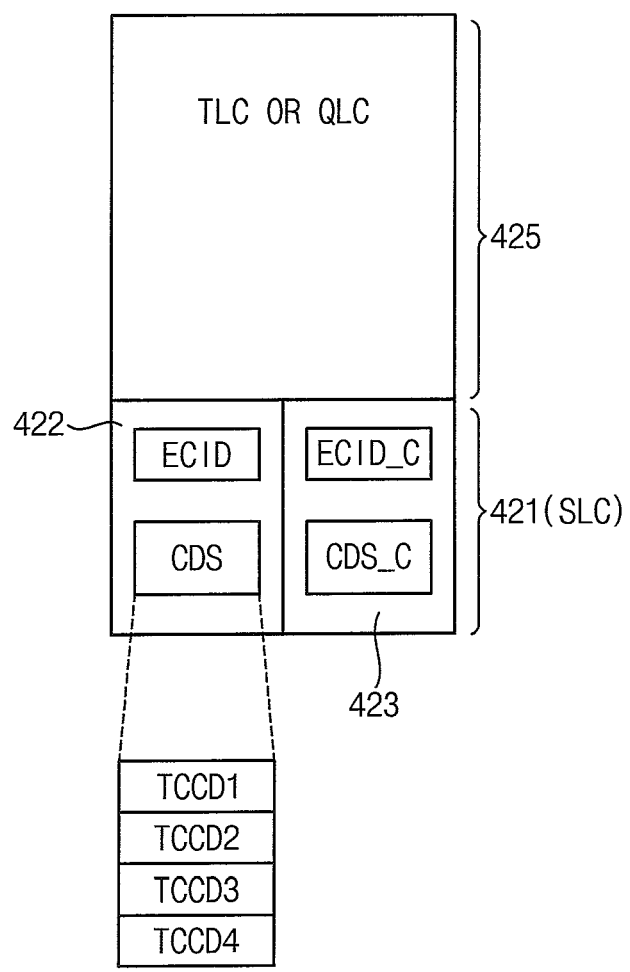
FIG. 19 is a block diagram illustrating an example of the memory cell array in the nonvolatile memory device of FIG. 15 according to example embodiments.

FIG. 19 is a block diagram illustrating an example of the memory cell array in the nonvolatile memory device of FIG. 15 according to example embodiments.

Referring to FIG. 19, the memory cell array 420 may include a first region 421 and a second region 425. The first region 421 may correspond to a SLC block including a plurality of SLCs and the second region 425 may correspond to a triple-level cell (TLC) block including a plurality of TLCs or a quadruple-level cell (QLC) block including a plurality of QLCs.

The first region 421 may include a main region 422 to store the compensation data set CDS and a replica block to store a copied version CDS_C of the compensation data set CDS. The compensation data set CDS may include trimming control codes TCCD1, TCCD2, TCCD3 and TCCD4 associated with control codes to render the low voltage detector 590, the LDO regulators 510a, 510b, 510c, and 510d, the oscillator 610, and the reference voltage generator 570 to provide corresponding outputs having target levels, respectively.

The main region may further include specific information ECID of the storage controller 300, associated with fabricating the storage controller 300, and the replica block may further include a copied version ECID_C of the specific information ECID. The specific information ECID may include information associated with generation of the storage controller 300 and location information indicating a location of a die in the wafer, in which the storage controller 300 is fabricated. The storage controller 300 may adjust the offsets of the analog circuits further based on the specific information ECID.

The control circuit 460 in FIG. 15 may program the compensation data set CDS and the specific information ECID in the first region 421 by unit of a page in a fabrication process of the nonvolatile memory device 400a.

FIG. 20 illustrates signals exchanged between a storage interface of the host and a host interface in the storage device in FIG. 8.

In FIG. 20, a storage interface 140a of the host 100 and a host interface 240a in the storage device 200 may be referred to as a first interface circuit and a second interface circuit, respectively, and may include a physical layer M-PHY and a UniPro corresponding to interface protocols suggested by Mobile Industry Processor Interface (MIPI) Alliance. The physical layer M-PHY of the first interface circuit 140a may include a pair of lines for transferring a differential input signal pair DIN_t and DIN_c, a pair of lines for transferring a differential output signal pair DOUT_t and DOUT_c and a line for transferring a reference clock signal REF_CLK.

The physical layer M-PHY of the first interface circuit 140a may transfer signals to the second interface circuit 240a through the output terminals DOUT_t and DOUT_c. The output terminals DOUT_t and DOUT_c may constitute a transmit channel M-TX of the first interface circuit 140a. For example, the signals that are transferred through the output terminals DOUT_t and DOUT_c may be a pair of differential signals. That is, a signal that is transferred through the output terminal DOUT_c may be complementary to a signal that is transferred through the output terminal DOUT_t.

The physical layer M-PHY of the first interface circuit 140a may receive signals from the second interface circuit 240a through the input terminals DIN_t and DIN_c. The input terminals DIN_t and DIN_c may constitute a receive channel M-RX of the first interface circuit 140a. For example, the signals that are received through the input terminals DIN_t and DIN_c may be a pair of differential signals. That is, a signal that is received through the input terminal DIN_c may be complementary to a signal that is received through the input terminal DIN_t.

The output terminals DOUT_t and DOUT_c and the input terminals DIN_t and DIN_c may be controlled to one of various states in compliance with a given protocol. For example, each of the output terminals DOUT_t and DOUT_c and the input terminals DIN_t and DIN_c may be controlled to a positive state DIF-P, a negative state DIF-N, a ground state DIF-Z, or a floating state DIF-Q.

When a level (e.g., a voltage level) of an output signal of the first output terminal DOUT_t is higher than a level of an output signal of the second output terminal DOUT_c, the output terminals DOUT_t and DOUT_c may be at the positive state DIF-P. When the level of the output signal of the first output terminal DOUT_t is lower than the level of the output signal of the second output terminal DOUT_c, the output terminals DOUT_t and DOUT_c may be at the negative state DIF-N. When the first output terminal DOUT_t and the second output terminal DOUT_c are floated, the output terminals DOUT_t and DOUT_c may be at the floating state DIF-Q. When the levels of the first output terminal DOUT_t and the second output terminal DOUT_c are equal, the output terminals DOUT_t and DOUT_c may be at the ground state DIF-Z.

When a level of an input signal of the first input terminal DIN_t is higher than a level of an input signal of the second input terminal DIN_c, the input terminals DIN_t and DIN_c may be at the positive state DIF-P. When the level of the input signal of the first input terminal DIN_t is lower than the level of the input signal of the second input terminal DIN_c, the input terminals DIN_t and DIN_c may be at the negative state DIF-N. When the first input terminal DIN_t and the second input terminal DIN_c are connected with terminals of a ground state, the input terminals DIN_t and DIN_c may be at the ground state DIF-Z. When the first input terminal DIN_t and the second input terminal DIN_c are floated, the input terminals DIN_t and DIN_c may be at the floating state DIF-Q.

The second interface circuit 240a may include input terminals DIN_t and DIN_c, output terminals DOUT_t and DOUT_c, and a clock terminal REF_CLK.

The output terminals DOUT_t and DOUT_c of the second interface circuit 240a may correspond to the input terminals DIN_t and DIN_c of the first interface circuit 140a, and the input terminals DIN_t and DIN_c of the second interface circuit 240a may correspond to the output terminals DOUT_t and DOUT_c of the first interface circuit 140a.

A physical layer M-PHY of the second interface circuit 240a may receive signals through the input terminals DIN_t and DIN_c and may transfer signals through the output terminals DOUT_t and DOUT_c. As in the above description given with reference to the first interface circuit 140a, the output terminals DOUT_t and DOUT_c and the input terminals DIN_t and DIN_c of the second interface circuit 240a may be controlled to the positive state DIF-P, the negative state DIF-N, the ground state DIF-Z, or the floating state DIF-Q.

Meanwhile, according to the MIPI M-PHY specification, the physical layer M-PHY of the second interface circuit 240a may a reference clock detector 245. The reference clock detector 245 may detect a change between the idle mode and the active mode of the storage device 200.

When the storage device 200 does not execute any operation, the storage device 200 may be in a first idle mode or a second idle mode. When storage device 200 is in the first idle mode or the second idle mode, the first interface circuit 140a may not transfer the reference clock REF_CLK to the second interface circuit 240a. When the storage device 200 switches from the first idle mode and/or the second idle mode to the active mode, the input terminals DIN_t and DIN_c of the second interface circuit 240a may switch from the floating state DIF-Q to the negative state DIF-N. When the storage device 200 switches from the first idle mode and/or the second idle mode to the active mode, the first interface circuit 140a may resume a transfer of the reference clock REF_CLK to the second interface circuit 240a.

In an example embodiment, when the storage device 200 is in the second idle mode, the reference clock detector 245 may generate the trigger signal allowing the storage device 200 to enter the active mode, based on toggling of the reference clock REF_CLK.

Figure 21A:
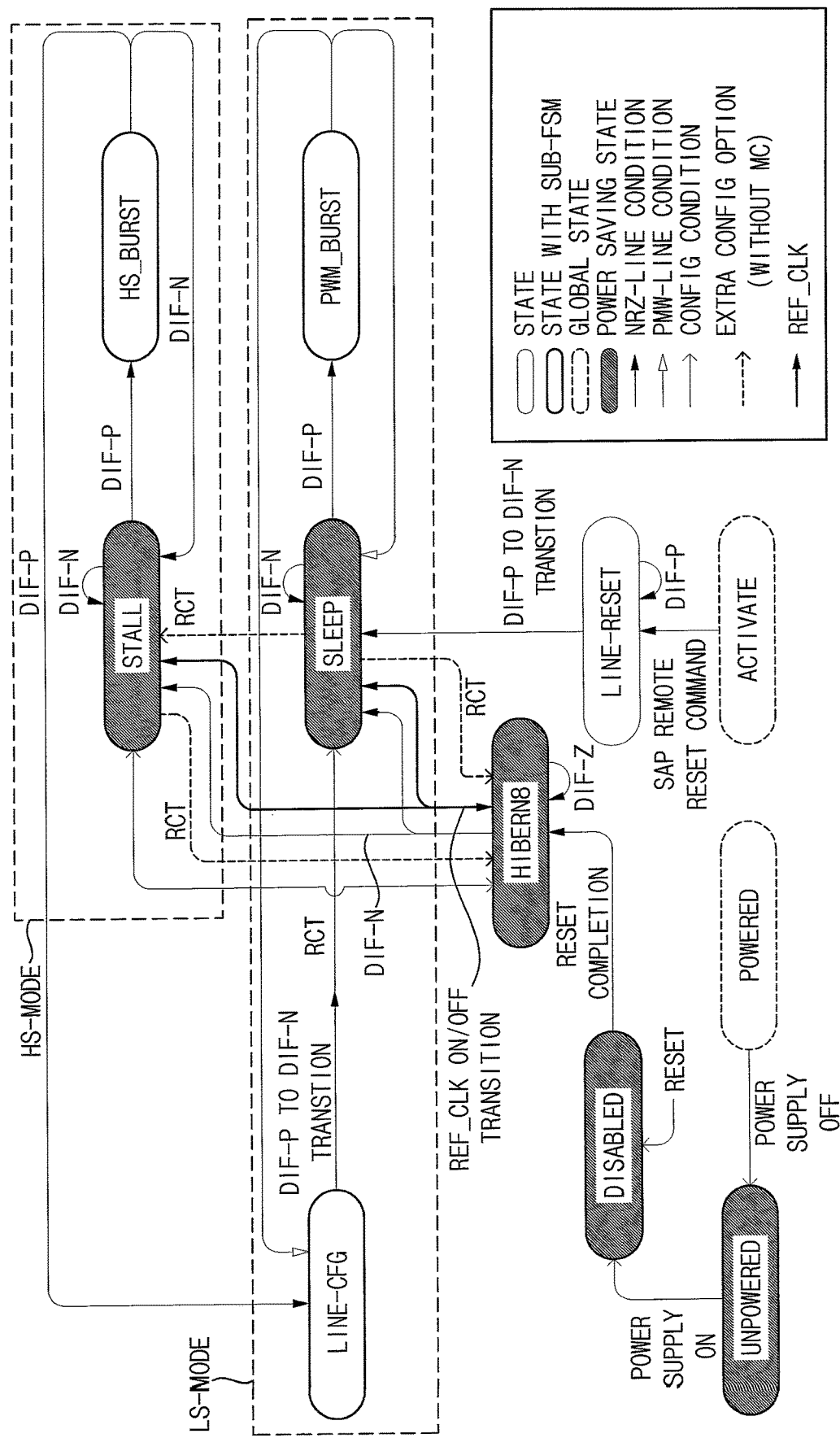
FIGS. 21A and 21B illustrate state machines of the first interface circuit and the second interface circuit in FIG. 20.
Figure 21B:
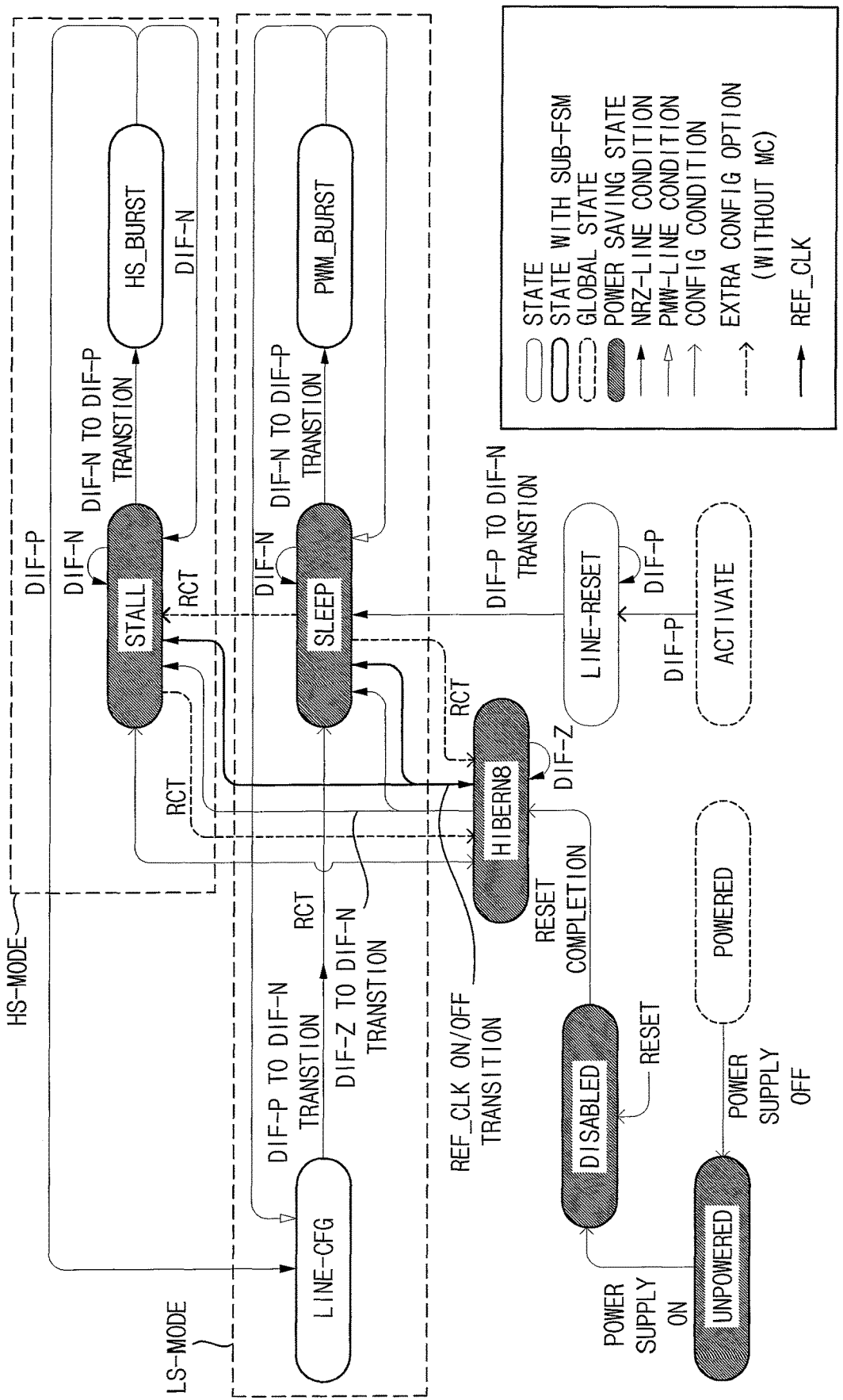

FIGS. 21A and 21B illustrate state machines of the first interface circuit and the second interface circuit in FIG. 20.

In detail, FIG. 21A illustrates a state machine of the output terminal M-TX of the first interface circuit 140a, and FIG. 21B illustrates a state machine of the input terminal M-RX of the second interface circuit 240a. For example, the state machines of FIGS. 21A and 21B may be associated with a Type-I module defined in the M-PHY protocol.

Referring to FIGS. 20, 21A, and 21B, the M-PHY protocol defines a high speed mode HS-MODE and a low speed mode LS-MODE of the second interface circuit 240a. Each of the high speed mode HS-MODE and the low speed mode LS-MODE may include a burst data transmission mode and a power saving state. In addition, the M-PHY protocol defines a hibernate state HIBERN8 being an ultra-low power state. The power saving state of the high speed mode HS-MODE may be the stall state STALL, and the power saving state of the low speed mode LS-MODE may be the sleep state SLEEP.

For example, the sleep state SLEEP and the stall state STALL of FIGS. 21A and 21B may correspond to the active mode described with reference to FIG. 20, and the hibernate state HIBERN8 may correspond to the idle mode described with reference to FIG. 20.

The storage device 200 may perform a mode switch even between the sleep state SLEEP or the stall state STALL being the power saving state and the hibernate state HIBERN8 being the ultra-low power state. For example, in the hibernate state HIBERN8, a power supply voltage may not be supplied to at least some components of the second interface circuit 240a. However, in the hibernate state HIBERN8, a power supply voltage may be supplied to some components of the second interface circuit 240a. That is, the hibernate state HIBERN8 may be a state in which the Unipro link startup sequence for a physical connection between the first interface circuit 140a and the second interface circuit 240a is not required.

As illustrated, in the case where the second interface circuit 240a is in the hibernate state HIBERN8, the host 100 may not provide the reference clock REF_CLK to the storage device 200. In the case where the second interface circuit 240a is in the sleep state SLEEP or the stall state STALL, the host 100 may provide the reference clock REF_CLK to the storage device 200.

In the case where the second interface circuit 240a is in the hibernate state HIBERN8, the reference clock detector 245 may detect toggling of the reference clock REF_CLK received from the first interface circuit 140a and may generate a trigger signal for allowing the storage device 200 to enter the active mode based on a result of the detection.

In FIGS. 21A and 21B, RCT denotes a reconfiguration trigger.

Even when the second interface circuit 240a is in the power saving state or in the hibernate state, the PMIC 500 provides the first operating voltage VOP1 to the SRAM 330 in FIG. 12 or FIG. 13, the storage controller 300 may adjust the offsets of the analog circuits based on the compensation data set CDS stored in the SRAM 330.

Figure 22:
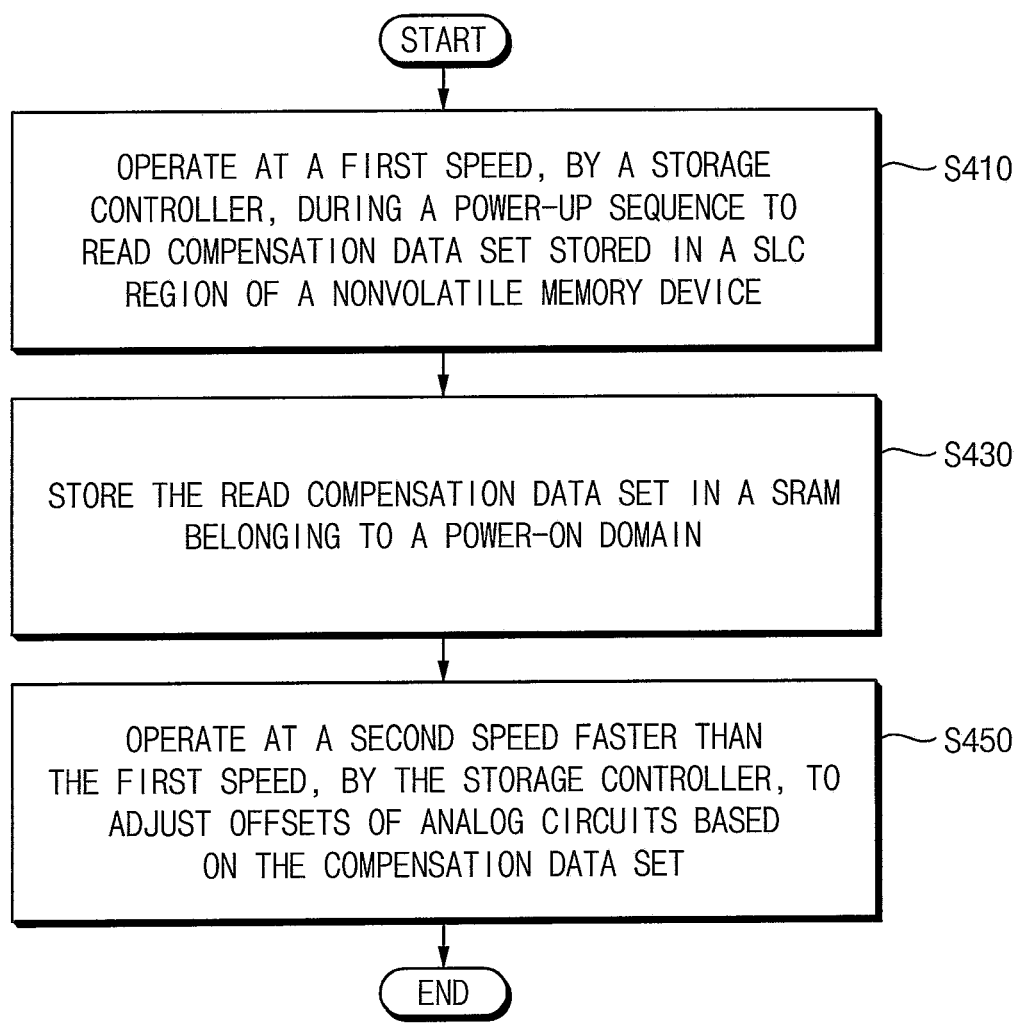
FIG. 22 is a flow chart illustrating a method of operating a storage device according to example embodiments.

FIG. 22 is a flow chart illustrating a method of operating a storage device according to example embodiments.

Referring to FIGS. 2, 8, 12, 13 and 22, there is provided a method of operating a storage device 200 which includes at least one nonvolatile memory device 400a including a first region and a second region and a storage controller 200 to control the at least one nonvolatile memory device 400a.

According to the method, the storage controller 200 operates at a first speed to read trimming control codes that compensate for offsets of analog circuits as compensation data set CDS from a first region 421 of the at least one nonvolatile memory device 400a during a power-up sequence of the storage device 200 (operation S410). The trimming control codes are obtained by the ATE 40 during a wafer-level test on the storage controller 300 and are stored in the first region 421.

The storage controller 300 stores the read compensation data set CDS in an SRAM 330 included in the storage controller 300 (operation S430). The storage controller 300 operates at a second speed faster than the first speed to adjust offsets of the analog circuits based on the compensation data set CDS stored in the SRAM 330 (operation S450).

Figure 23:
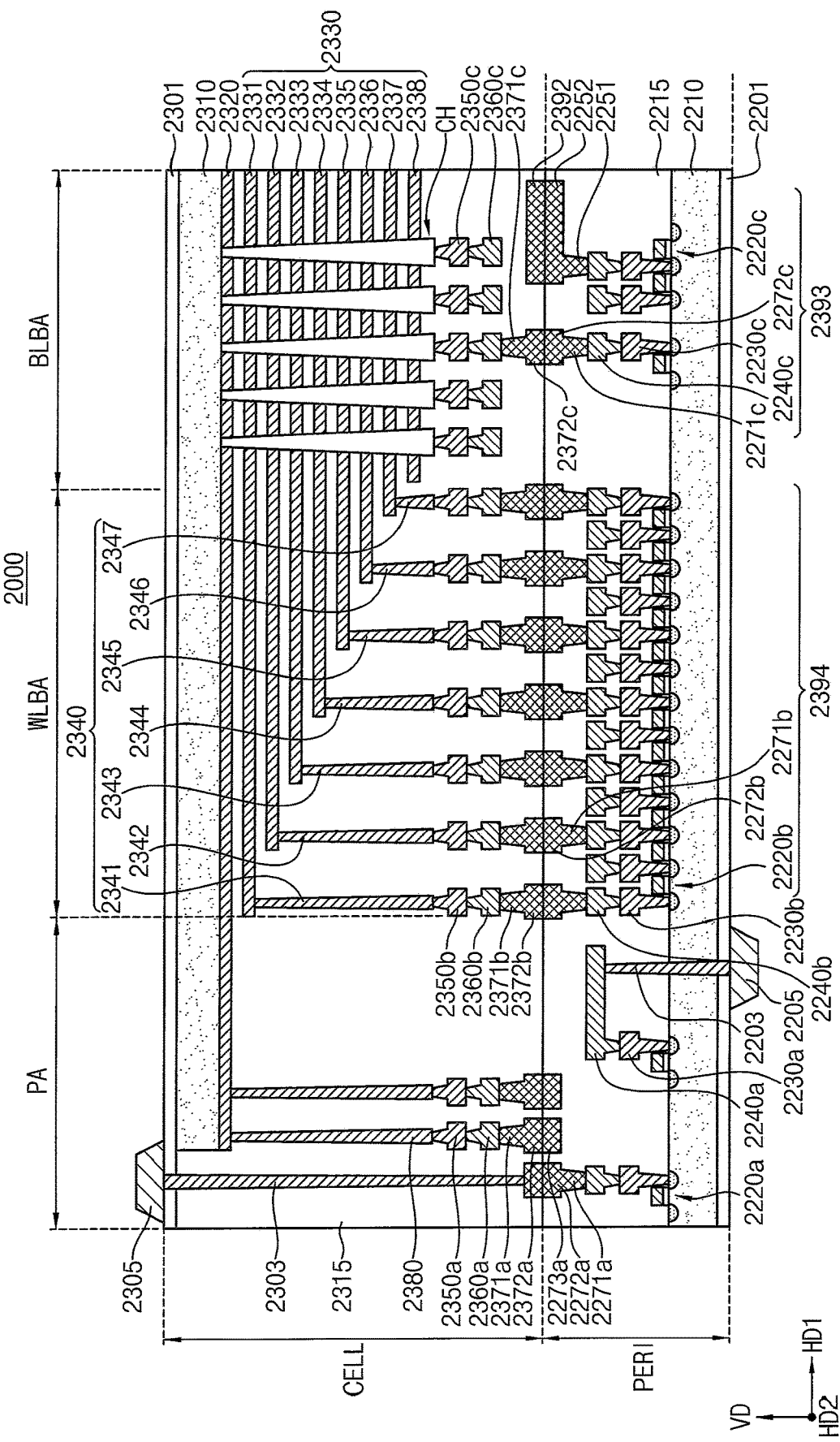
FIG. 23 is a cross-sectional view of a nonvolatile memory device according to example embodiments.

FIG. 23 is a cross-sectional view of a nonvolatile memory device according to example embodiments.

Referring to FIG. 23, a nonvolatile memory device 2000 (the nonvolatile memory device 2000 may be also referred to as a memory device) may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high electrical resistivity, and the second metal layers 2240a, 2240b, and 2240c may be formed of copper having relatively low electrical resistivity.

In an example embodiment illustrated in FIG. 23, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The least one memory block may include a first region and a second region. The first region may store compensation data set and may correspond to SLC block. The cell region CELL may include a second substrate 2310 and a common source line 2320. On the second substrate 2310, a plurality of word-lines 2331, 2332, 2333, 2334, 2335, 2336, 2337, and 2338 (e.g., 2330) may be stacked in a vertical direction VD (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction VD, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In an example embodiment, the bit-line 2360c may extend in a second horizontal direction HD2 (e.g., a Y-axis direction), parallel to the upper surface of the second substrate 2310.

In an example embodiment illustrated in FIG. 23, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first horizontal direction HD1 (e.g., an X-axis direction), parallel to the upper surface of the second substrate 2310 and perpendicular to the second horizontal direction HD2, and may be connected to a plurality of cell contact plugs 2341, 2342, 2343, 2344, 2345, 2346, and 2347 (i.e., 2340). The plurality of word-lines 2330 and the plurality of cell contact plugs 2340 may be connected to each other in pads provided by at least a portion of the plurality of word-lines 2330 extending in different lengths in the first horizontal direction HD1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming an address decoder 2394 in the peripheral circuit region PERI. In an example embodiment, operating voltages of the circuit elements 2220b forming the address decoder 2394 may be different than operating voltages of the circuit elements 2220c forming the page buffer circuit 2393. For example, operating voltages of the circuit elements 2220c forming the page buffer circuit 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In the example embodiment, the second input/output pad 2305 is electrically connected to a circuit element 2220a.

According to embodiments, the second substrate 2310 and the common source line 2320 may not be disposed in an area in which the second input/output contact plug 2303 is disposed. Also, the second input/output pad 2305 may not overlap the word-lines 2330 in the vertical direction HD. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern provided on an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the external pad bonding area PA, the memory device 2000 may include lower bonding metals 2271a and 2271b connected to the lower metal pattern 2273a. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL. Similarly, in the external pad bonding area PA, an upper bonding metal 2371a may be formed and may be electrically connected to the upper metal pattern 2372a.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL.

Figure 24:
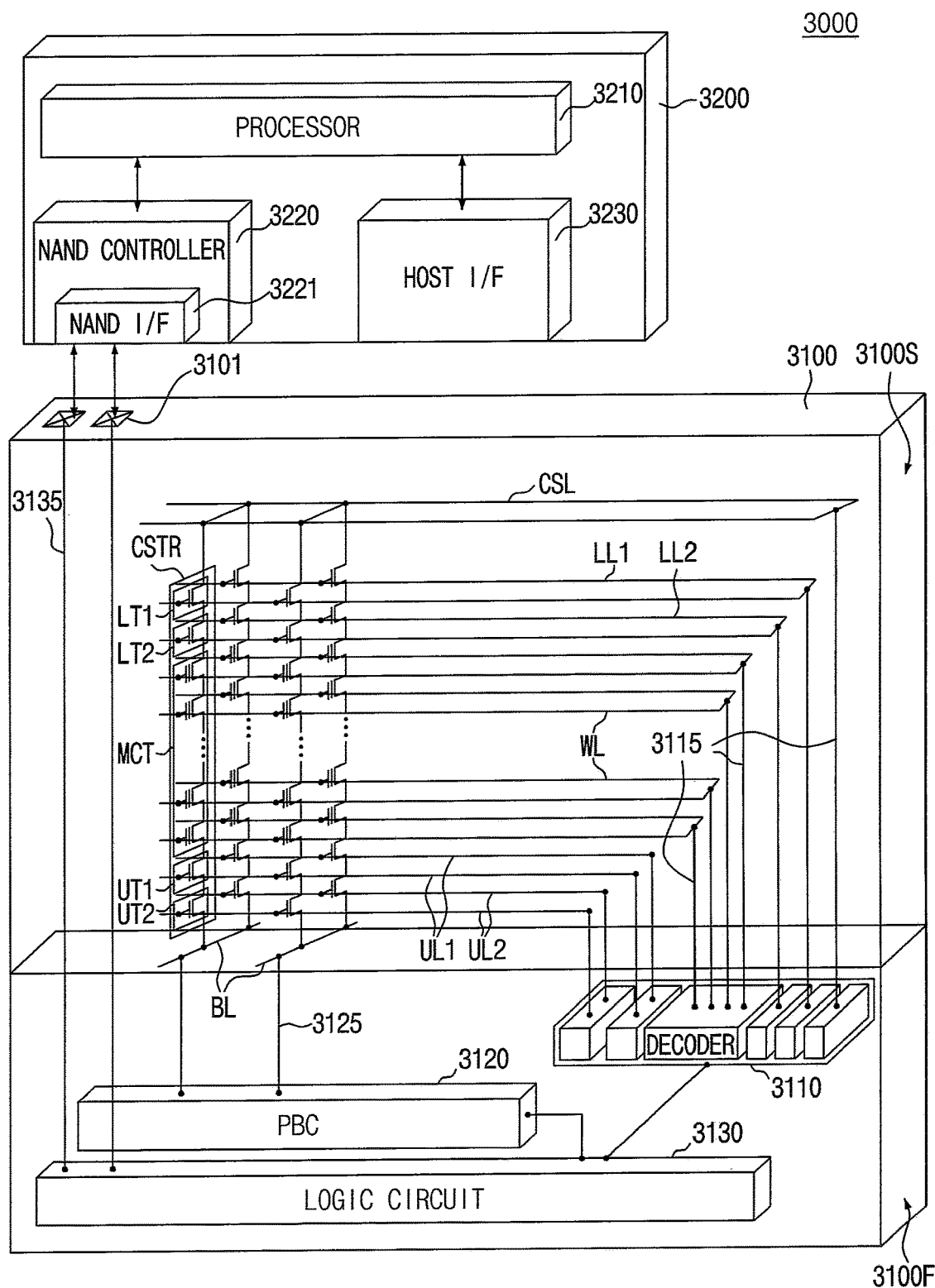
FIG. 24 is a block diagram illustrating an electronic system including a semiconductor device according to example embodiments.

FIG. 24 is a block diagram illustrating an electronic system including a semiconductor device according to example embodiments.

Referring to FIG. 24, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be a non-volatile memory device, for example, a NAND flash memory device that will be illustrated with reference to FIGS. 6 to 21. The semiconductor device 3100 may include a first structure 3100F and a second structure 3100S on the first structure 3100F. The first structure 3100F may be a peripheral circuit structure including a decoder circuit 3110, a page buffer circuit 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 1115 extending to the second structure 3110S in the first structure 3100F. The bit-lines BL may be electrically connected to the page buffer circuit 3120 through second connection wirings 3125 extending to the second structure 3100S in the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S in the first structure 3100F.

The controller 3200 may include a processor 3210, a NAND controller 3220, and a host interface 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, a control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to example embodiments may be packaged using various package types or package configurations.

The present disclosures may be applied to various electronic devices including a nonvolatile memory device. For example, the present disclosures may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims.

What is claimed is:

1. A storage device, comprising:
a storage controller including a plurality of analog circuits; and
at least one nonvolatile memory device including a first region and a second region,
wherein the at least one nonvolatile memory device is configured to:
store user data in the second region; and
store trimming control codes in the first region as a compensation data set,
wherein the trimming control codes are configured to compensate for offsets of the plurality of analog circuits, and are obtained through a wafer-level test on the storage controller, and
wherein the storage controller, during a power-up sequence, is configured to:
read the compensation data set from the first region of the at least one nonvolatile memory device;
store the read compensation data set therein; and
adjust the offsets of the plurality of analog circuits based on the stored compensation data set.

2. The storage device of claim 1, wherein:
the plurality of analog circuits are configured to provide outputs varying based on respective one of a plurality of control codes, and
the storage controller is configured to provide, to an automatic test equipment, the trimming control codes in response to each of the plurality of analog circuits providing a corresponding output having a target level in response to varying respective one of the plurality of control codes during the wafer-level test.

3. The storage device of claim 1, wherein the first region corresponds to a single level cell block including a plurality of single level cells, each one of the plurality of single level cells being configured to store a single bit data.

4. The storage device of claim 1, wherein the first region corresponds to a single level cell block including a plurality of single level cells, each one of the plurality of single level cells being configured to store a single bit data, and
wherein the single level cell block includes:
a main block configured to store the compensation data set; and
a replica block configured to store a copied version of the compensation data set.

5. The storage device of claim 4, wherein the storage controller further includes:
a processor configured to control an operation of the storage controller; and
an error correction code (ECC) engine configured to perform an ECC decoding operation on the compensation data set read from the main block to detect at least one error in the compensation data set.

6. The storage device of claim 5, wherein the processor is further configured, in response to the ECC engine detecting uncorrectable errors in the compensation data set based on a result of the ECC decoding operation, to:
read the copied version of the compensation data set from the replica block; and
adjust the offsets of the plurality of analog circuits based on the copied version of the compensation data set.

7. The storage device of claim 5, wherein the processor is further configured, in response to the ECC engine detecting uncorrectable errors in the compensation data set based on a result of the ECC decoding operation, to:
read the copied version of the compensation data set from the replica block; and
replace the compensation data set stored therein with the copied version of the compensation data set read from the replica block.

8. The storage device of claim 1, wherein the storage controller is further configured to:
operate at a first speed and read the compensation data set from the first region of the at least one nonvolatile memory device to store the read compensation data set in a static random access memory (SRAM) in the storage controller; and
operate at a second speed faster than the first speed and adjust the offsets of the plurality of analog circuits based on the compensation data set stored in the SRAM.

9. The storage device of claim 8, wherein, during the power-up sequence, the SRAM belongs to a power-on domain of the storage controller.

10. The storage device of claim 9, further comprising a power management integrated circuit (PMIC) configured to:
provide a first operating voltage to the storage controller; and
provide a second operating voltage to the at least one nonvolatile memory device, based on external voltages,
wherein the PMIC is further configured to provide the first operating voltage to the SRAM in a power saving state and in a hibernate state of the storage controller.

11. The storage device of claim 1, wherein:
the first region further stores specific information of the storage controller, associated with fabricating the storage controller, and
the storage controller is further configured to adjust the offsets further based on the specific information.

12. The storage device of claim 1, further comprising:
a power management integrated circuit (PMIC) configured to:
provide a first operating voltage to the storage controller; and
provide a second operating voltage to the at least one nonvolatile memory device, based on external voltages,
wherein the storage controller further includes:
a processor configured to control an operation of the storage controller;
a nonvolatile memory interface configured to interface with the at least one nonvolatile memory device; and
a power-on reset circuit configured to reset the plurality of analog circuits in response to a voltage level of the first operating voltage being smaller than a reference level.

13. The storage device of claim 12, wherein the plurality of analog circuits includes:
a low voltage detector configured to generate a reset flag in response to the voltage level of the first operating voltage being smaller than the reference level, and provide the reset flag to the power-on reset circuit;
a plurality of low drop-out regulators configured to generate a plurality of output voltages based on the first operating voltage and at least one reference voltage;
an oscillator configured to generate a reference clock signal associated with an operating frequency of the processor based on one of the plurality of output voltages; and
a reference voltage generator configured to generate the at least one reference voltage.

14. The storage device of claim 13, wherein:
the low voltage detector is configured to adjust the reference level based on a first control code;
each of the plurality of low drop-out regulators is configured to adjust a level of respective one of the plurality of output voltages based on a respective one of a plurality of sub control codes included in a second control code;
the oscillator configured to adjust a frequency of the reference clock signal based on a third control code; and
the reference voltage generator configured to adjust a level of the at least one reference voltage based on a fourth control code.

15. The storage device of claim 1, wherein the at least one nonvolatile memory device includes:

a memory cell array including the first region and the second region;
a voltage generator configured to generate word-line voltages based on control signals;
an address decoder coupled to the memory cell array through a plurality of word-lines, the address decoder configured to transfer the word-line voltages to the memory cell array based on a row address;
a page buffer circuit coupled to the memory cell array through a plurality of bit-lines, the page buffer circuit configured to store the user data and the compensation data set in the memory cell array; and
a control circuit configured to control the voltage generator, the address decoder and the page buffer circuit based on a command and an address received from the storage controller,
wherein the control circuit is configured to program the compensation data set in the first region by unit of a page.

16. The storage device of claim 15, wherein the memory cell array includes a plurality of memory blocks, and
wherein at least one of the plurality of memory blocks include a plurality of cell strings, and each of the plurality of cell strings includes a plurality of memory cells stacked in a vertical direction with respect to a substrate.

17. The storage device of claim 1, wherein the at least one nonvolatile memory device includes:
a memory cell region including a memory cell array and a first metal pad, the memory cell array including the first region and the second region and including a plurality of cell strings, each of the plurality of cell strings including a plurality of memory cells stacked in a vertical direction with respect to a substrate; and
a peripheral circuit region including a second metal pad, the peripheral circuit region vertically connected to the memory cell region through the first metal pad and the second metal pad,
wherein the peripheral circuit region includes:
a voltage generator configured to generate word-line voltages based on control signals;
an address decoder coupled to the memory cell array through a plurality of word-lines, the address decoder being configured to transfer the word-line voltages to the memory cell array based on a row address;
a page buffer circuit coupled to the memory cell array through a plurality of bit-lines, the page buffer circuit being configured to store the user data and the compensation data set in the memory cell array; and
a control circuit configured to control the voltage generator, the address decoder and the page buffer circuit based on a command and an address received from the storage controller,
wherein the control circuit is configured to program the compensation data set in the first region by unit of a page.

18. A method of operating a storage device, wherein the storage device includes at least one nonvolatile memory device including a first region and a second region and a storage controller configured to control the at least one nonvolatile memory device, the method comprising:
operating, by the storage controller, at a first speed to read trimming control codes in the first region as a compensation data set, the trimming control codes compensating for offsets of a plurality of analog circuits and being obtained through a wafer-level test on the storage controller;

storing the read compensation data set in a static random access memory (SRAM) in the storage controller; and operating, by the storage controller, at a second speed faster than the first speed to adjust the offsets of the plurality of analog circuits based on the compensation data set stored in the SRAM.

19. The method of claim 18, wherein:

the plurality of analog circuits are configured to provide outputs varying based on respective one of a plurality of control codes;

the storage controller is configured to obtain the trimming control codes in response to each of the plurality of analog circuits providing a corresponding output having a target level in response to varying respective one of the plurality of control codes during the wafer-level test; and the first region corresponds to a single level cell block including a plurality of single level cells, each one of the plurality of single level cells storing a single bit data.

20. A storage device, comprising:

a storage controller including a plurality of analog circuits configured to provide outputs varying based on respective one of a plurality of control codes; and at least one nonvolatile memory device including a first region and a second region, wherein the at least one nonvolatile memory device is configured to:

store user data in the second region; and store trimming control codes in the first region as a compensation data set, wherein the trimming control codes are configured to compensate for offsets of the plurality of analog circuits and are obtained through a wafer-level test on the storage controller, wherein the storage controller, during a power-up sequence, is configured to:

read the compensation data set from the first region of the at least one nonvolatile memory device;

store the read compensation data therein; and adjust the offsets of the plurality of analog circuits based on the compensation data set stored therein, wherein each of the trimming control codes corresponds to a control code when each of the plurality of analog circuits provides a corresponding output having a target level during the wafer-level test, and wherein the first region corresponds to a single level cell block including a plurality of single level cells, each one of the plurality of single level cells being configured to store a single bit data.

* * * * *